United States Patent
Lock

(10) Patent No.: US 10,586,683 B2
(45) Date of Patent: Mar. 10, 2020

(54) METHOD AND DEVICE FOR CHARACTERIZING AN ELECTRON BEAM

(71) Applicant: Arcam AB, Moelndal (SE)

(72) Inventor: Tomas Lock, Vaestra Froelunda (SE)

(73) Assignee: Arcam AB, Moelndal (SE)

( * ) Notice: Subject to any disclaimer, the term of this patent is extended or adjusted under 35 U.S.C. 154(b) by 0 days.

(21) Appl. No.: 15/630,199

(22) Filed: Jun. 22, 2017

(65) Prior Publication Data
US 2017/0294288 A1   Oct. 12, 2017

Related U.S. Application Data

(62) Division of application No. 14/973,230, filed on Dec. 17, 2015, now Pat. No. 9,721,755.
(Continued)

(51) Int. Cl.
*H01J 37/304* (2006.01)
*H01J 37/305* (2006.01)
(Continued)

(52) U.S. Cl.
CPC ........ *H01J 37/3045* (2013.01); *B22F 3/1055* (2013.01); *B23K 15/002* (2013.01); *B23K 15/0013* (2013.01); *B23K 15/0026* (2013.01); *B23K 15/0086* (2013.01); *B23K 15/02* (2013.01); *B28B 1/001* (2013.01); *B28B 17/00* (2013.01); *B28B 17/0081* (2013.01);
(Continued)

(58) Field of Classification Search
CPC .......... H01J 37/00; H01J 37/02; H01J 37/023; H01J 37/244; H01J 37/248; H01J 37/26; H01J 37/261; H01J 37/224

USPC .......... 250/305, 306, 307, 311, 492.1, 492.3
See application file for complete search history.

(56) References Cited

U.S. PATENT DOCUMENTS

| 2,264,968 A | 12/1941 | De Forest |
| 2,323,715 A | 7/1943 | Kuehni |
(Continued)

FOREIGN PATENT DOCUMENTS

| CA | 2860188 A1 | 6/2006 |
| CN | 101607311 A | 12/2009 |
(Continued)

OTHER PUBLICATIONS

Klassen, Alexander, et al., "Modelling of Electron Beam Absorption in Complex Geometries", *Journal Of Physics D: Applied Physics*, Jan. 15, 2014, 12 pages, vol. 47, No. 6, Institute Of Physics Publishing Ltd., Great Britain.
(Continued)

*Primary Examiner* — Jason L McCormack
(74) *Attorney, Agent, or Firm* — Dinsmore & Shohl LLP

(57) ABSTRACT

A device for detecting X-rays radiated out of a substrate surface, said device comprising at least one X-ray detector, a resolver grating and a modulator grating, said resolver grating with at least one opening facing towards said X-ray detector is arranged in front of said X-ray detector. Said modulator grating is provided between said resolver grating and said substrate at a predetermined distance from said resolver grating and said substrate, where said modulator grating having a plurality of openings in at least a first direction, wherein said x-rays from said surface is spatially modulated with said modulator grating and resolver grating.

22 Claims, 11 Drawing Sheets

Related U.S. Application Data

(60) Provisional application No. 62/106,089, filed on Jan. 21, 2015.

(51) Int. Cl.

| | | |
|---|---|---|
| *H01J 37/244* | (2006.01) | |
| *B23K 15/00* | (2006.01) | |
| *G01T 1/29* | (2006.01) | |
| *B33Y 50/02* | (2015.01) | |
| *B29C 64/386* | (2017.01) | |
| *H01J 37/30* | (2006.01) | |
| *B29C 64/20* | (2017.01) | |
| *B29C 64/153* | (2017.01) | |
| *B33Y 10/00* | (2015.01) | |
| *B33Y 40/00* | (2020.01) | |
| *B22F 3/105* | (2006.01) | |
| *B23K 15/02* | (2006.01) | |
| *B28B 1/00* | (2006.01) | |
| *B28B 17/00* | (2006.01) | |
| *H01J 37/317* | (2006.01) | |
| *H01J 37/09* | (2006.01) | |
| *B33Y 30/00* | (2015.01) | |

(52) U.S. Cl.
CPC ............ *B29C 64/153* (2017.08); *B29C 64/20* (2017.08); *B29C 64/386* (2017.08); *B33Y 10/00* (2014.12); *B33Y 40/00* (2014.12); *B33Y 50/02* (2014.12); *G01T 1/295* (2013.01); *H01J 37/09* (2013.01); *H01J 37/244* (2013.01); *H01J 37/30* (2013.01); *H01J 37/304* (2013.01); *H01J 37/3005* (2013.01); *H01J 37/305* (2013.01); *H01J 37/317* (2013.01); *B22F 2003/1056* (2013.01); *B22F 2003/1057* (2013.01); *B33Y 30/00* (2014.12); *H01J 2237/0453* (2013.01); *H01J 2237/2445* (2013.01); *H01J 2237/2448* (2013.01); *H01J 2237/24514* (2013.01); *H01J 2237/2826* (2013.01); *H01J 2237/3045* (2013.01); *H01J 2237/30433* (2013.01); *H01J 2237/30472* (2013.01); *H01J 2237/3128* (2013.01); *Y02P 10/295* (2015.11)

(56) References Cited

U.S. PATENT DOCUMENTS

| | | | |
|---|---|---|---|
| 3,634,644 A | | 1/1972 | Ogden et al. |
| 3,829,688 A | | 8/1974 | Barrett |
| 3,838,496 A | | 10/1974 | Kelly |
| 3,882,477 A | | 5/1975 | Mueller |
| 3,906,229 A | * | 9/1975 | DeMeester ............ G01T 1/295 250/308 |
| 3,908,124 A | * | 9/1975 | Rose ................... H01J 37/244 250/310 |
| 3,936,639 A | | 2/1976 | Barrett |
| 4,017,730 A | | 4/1977 | Barrett |
| 4,164,640 A | | 8/1979 | Scheffels |
| 4,314,134 A | | 2/1982 | Schumacher et al. |
| 4,348,576 A | | 9/1982 | Anderl et al. |
| 4,352,565 A | | 10/1982 | Rowe et al. |
| 4,401,719 A | | 8/1983 | Kobayashi et al. |
| 4,541,055 A | | 9/1985 | Wolfe et al. |
| 4,651,002 A | * | 3/1987 | Anno .................... A61B 6/06 250/336.1 |
| 4,818,562 A | | 4/1989 | Arcella et al. |
| 4,843,246 A | | 6/1989 | Benes et al. |
| 4,863,538 A | | 9/1989 | Deckard |
| 4,888,490 A | | 12/1989 | Bass et al. |
| 4,927,992 A | | 5/1990 | Whitlow et al. |
| 4,958,431 A | | 9/1990 | Clark et al. |
| 4,988,844 A | | 1/1991 | Dietrich et al. |
| 5,051,599 A | | 9/1991 | Benes et al. |
| 5,118,192 A | | 6/1992 | Chen et al. |
| 5,135,695 A | | 8/1992 | Marcus |
| 5,167,989 A | | 12/1992 | Dudek et al. |
| 5,182,170 A | | 1/1993 | Marcus et al. |
| 5,204,055 A | | 4/1993 | Sachs et al. |
| 5,247,560 A | * | 9/1993 | Hosokawa ............ A61B 6/505 378/51 |
| 5,393,482 A | | 2/1995 | Benda et al. |
| 5,483,036 A | | 1/1996 | Giedt et al. |
| 5,508,489 A | | 4/1996 | Benda et al. |
| 5,511,103 A | | 4/1996 | Hasegawa |
| 5,595,670 A | | 1/1997 | Mombo-Caristan |
| 5,647,931 A | | 7/1997 | Retallick et al. |
| 5,753,274 A | | 5/1998 | Wilkening et al. |
| 5,837,960 A | | 11/1998 | Lewis et al. |
| 5,876,550 A | | 3/1999 | Feygin et al. |
| 5,904,890 A | | 5/1999 | Lohner et al. |
| 5,932,290 A | | 8/1999 | Lombardi et al. |
| 6,046,426 A | | 4/2000 | Jeantette et al. |
| 6,162,378 A | | 12/2000 | Bedal et al. |
| 6,204,469 B1 | | 3/2001 | Fields et al. |
| 6,419,203 B1 | | 7/2002 | Dang |
| 6,537,052 B1 | | 3/2003 | Adler |
| 6,554,600 B1 | | 4/2003 | Hofmann et al. |
| 6,583,379 B1 | | 6/2003 | Meiners et al. |
| 6,676,892 B2 | | 1/2004 | Das et al. |
| 6,724,001 B1 | | 4/2004 | Pinckney et al. |
| 6,746,506 B2 | | 6/2004 | Liu et al. |
| 6,751,516 B1 | | 6/2004 | Richardson |
| 6,764,636 B1 | | 7/2004 | Allanic et al. |
| 6,811,744 B2 | | 11/2004 | Keicher et al. |
| 6,815,636 B2 | | 11/2004 | Chung et al. |
| 6,824,714 B1 | | 11/2004 | Türck et al. |
| 7,003,864 B2 | | 2/2006 | Dirscherl |
| 7,020,539 B1 | | 3/2006 | Kovacevic et al. |
| 7,165,498 B2 | | 1/2007 | Mackrill et al. |
| 7,204,684 B2 | | 4/2007 | Ederer et al. |
| 7,291,002 B2 | | 11/2007 | Russell et al. |
| 7,452,500 B2 | | 11/2008 | Uckelmann |
| 7,454,262 B2 | | 11/2008 | Larsson et al. |
| 7,537,722 B2 | | 5/2009 | Andersson et al. |
| 7,540,738 B2 | | 6/2009 | Larsson et al. |
| 7,569,174 B2 | | 8/2009 | Ruatta et al. |
| 7,635,825 B2 | | 12/2009 | Larsson |
| 7,686,605 B2 | | 3/2010 | Perret et al. |
| 7,696,501 B2 | | 4/2010 | Jones |
| 7,713,454 B2 | | 5/2010 | Larsson |
| 7,754,135 B2 | | 7/2010 | Abe et al. |
| 7,799,253 B2 | | 9/2010 | Höchsmann et al. |
| 7,871,551 B2 | | 1/2011 | Wallgren et al. |
| 7,888,626 B2 | | 2/2011 | Slinger et al. |
| 8,021,138 B2 | | 9/2011 | Green |
| 8,083,513 B2 | | 12/2011 | Montero-Escuder et al. |
| 8,137,739 B2 | | 3/2012 | Philippi et al. |
| 8,187,521 B2 | | 5/2012 | Larsson et al. |
| 8,308,466 B2 | | 11/2012 | Ackelid et al. |
| 8,992,816 B2 | | 3/2015 | Jonasson et al. |
| 9,073,265 B2 | | 7/2015 | Snis |
| 9,079,248 B2 | | 7/2015 | Ackelid |
| 9,126,167 B2 | | 9/2015 | Ljungblad |
| 9,254,535 B2 | | 2/2016 | Buller et al. |
| 9,310,188 B2 | | 4/2016 | Snis |
| 9,505,172 B2 | | 11/2016 | Ljungblad |
| 9,550,207 B2 | | 1/2017 | Ackelid |
| 9,802,253 B2 | | 10/2017 | Jonasson |
| 9,950,367 B2 | | 4/2018 | Backlund et al. |
| 10,071,422 B2 | | 9/2018 | Buller et al. |
| 2002/0104973 A1 | | 8/2002 | Kerekes |
| 2002/0152002 A1 | | 10/2002 | Lindemann et al. |
| 2002/0195747 A1 | | 12/2002 | Hull et al. |
| 2003/0043360 A1 | | 3/2003 | Farnworth |
| 2003/0133822 A1 | | 7/2003 | Harryson |
| 2003/0205851 A1 | | 11/2003 | Laschutza et al. |
| 2004/0012124 A1 | | 1/2004 | Li et al. |
| 2004/0026807 A1 | | 2/2004 | Andersson et al. |
| 2004/0084814 A1 | | 5/2004 | Boyd et al. |
| 2004/0104499 A1 | | 6/2004 | Keller |

(56) References Cited

U.S. PATENT DOCUMENTS

| | | |
|---|---|---|
| 2004/0148048 A1 | 7/2004 | Farnworth |
| 2004/0173496 A1 | 9/2004 | Srinivasan |
| 2004/0173946 A1 | 9/2004 | Pfeifer et al. |
| 2004/0204765 A1 | 10/2004 | Fenning et al. |
| 2004/0217095 A1 | 11/2004 | Herzog |
| 2005/0173380 A1 | 8/2005 | Carbone |
| 2005/0186538 A1 | 8/2005 | Uckelmann |
| 2005/0282300 A1* | 12/2005 | Yun .................. G01N 23/2252 438/14 |
| 2006/0108712 A1 | 5/2006 | Mattes |
| 2006/0138325 A1* | 6/2006 | Choi .................. G01N 23/2252 250/310 |
| 2006/0145381 A1 | 7/2006 | Larsson |
| 2006/0147332 A1 | 7/2006 | Jones et al. |
| 2006/0157892 A1 | 7/2006 | Larsson |
| 2006/0180957 A1 | 8/2006 | Hopkinson et al. |
| 2006/0284088 A1 | 12/2006 | Fukunaga et al. |
| 2007/0074659 A1 | 4/2007 | Wahlstrom |
| 2007/0175875 A1 | 8/2007 | Uckelmann et al. |
| 2007/0179655 A1 | 8/2007 | Farnworth |
| 2007/0182289 A1 | 8/2007 | Kigawa et al. |
| 2007/0298182 A1 | 12/2007 | Perret et al. |
| 2008/0236738 A1 | 10/2008 | Lo et al. |
| 2009/0017219 A1 | 1/2009 | Paasche et al. |
| 2009/0152771 A1 | 6/2009 | Philippi et al. |
| 2009/0206056 A1 | 8/2009 | Xu et al. |
| 2010/0007062 A1 | 1/2010 | Larsson et al. |
| 2010/0260410 A1 | 10/2010 | Taminger et al. |
| 2010/0305743 A1 | 12/2010 | Larsson |
| 2010/0310404 A1 | 12/2010 | Ackelid |
| 2010/0316856 A1 | 12/2010 | Currie et al. |
| 2011/0061591 A1 | 3/2011 | Stecker |
| 2011/0114839 A1 | 5/2011 | Stecker et al. |
| 2011/0133367 A1 | 6/2011 | Weidinger et al. |
| 2011/0240607 A1 | 10/2011 | Stecker et al. |
| 2011/0241575 A1 | 10/2011 | Caiafa et al. |
| 2011/0293770 A1 | 12/2011 | Ackelid et al. |
| 2011/0293771 A1 | 12/2011 | Oberhofer et al. |
| 2011/0309554 A1 | 12/2011 | Liska et al. |
| 2011/0316178 A1 | 12/2011 | Uckelmann |
| 2012/0100031 A1 | 4/2012 | Ljungblad |
| 2012/0164322 A1 | 6/2012 | Teulet |
| 2012/0183701 A1 | 7/2012 | Pilz et al. |
| 2012/0193530 A1 | 8/2012 | Parker et al. |
| 2012/0211155 A1 | 8/2012 | Wehning et al. |
| 2012/0223059 A1 | 9/2012 | Ackelid |
| 2012/0225210 A1 | 9/2012 | Fruth |
| 2012/0237745 A1 | 9/2012 | Dierkes et al. |
| 2012/0266815 A1 | 10/2012 | Brunermer |
| 2013/0055568 A1 | 3/2013 | Dusel et al. |
| 2013/0162134 A1 | 6/2013 | Mattausch et al. |
| 2013/0186514 A1 | 7/2013 | Zhuang et al. |
| 2013/0216959 A1 | 8/2013 | Tanaka et al. |
| 2013/0233846 A1 | 9/2013 | Jakimov et al. |
| 2013/0264750 A1 | 10/2013 | Hofacker et al. |
| 2013/0270750 A1 | 10/2013 | Green |
| 2013/0278920 A1 | 10/2013 | Loewgren |
| 2013/0300286 A1 | 11/2013 | Ljungblad et al. |
| 2013/0343947 A1 | 12/2013 | Satzger et al. |
| 2014/0175708 A1 | 6/2014 | Echigo et al. |
| 2014/0271964 A1 | 9/2014 | Roberts, IV et al. |
| 2014/0301884 A1 | 10/2014 | Hellestam et al. |
| 2014/0308153 A1 | 10/2014 | Ljungblad |
| 2014/0314609 A1 | 10/2014 | Ljungblad et al. |
| 2014/0314964 A1 | 10/2014 | Ackelid |
| 2014/0348691 A1 | 11/2014 | Ljungblad et al. |
| 2014/0363327 A1 | 12/2014 | Holcomb |
| 2014/0367367 A1 | 12/2014 | Wood et al. |
| 2015/0004045 A1 | 1/2015 | Ljungblad |
| 2015/0050463 A1 | 2/2015 | Nakano et al. |
| 2015/0071809 A1 | 3/2015 | Nordkvist et al. |
| 2015/0086409 A1 | 3/2015 | Hellestam |
| 2015/0088295 A1 | 3/2015 | Hellestam |
| 2015/0130118 A1 | 5/2015 | Cheng et al. |
| 2015/0139849 A1 | 5/2015 | Pialot, Jr. et al. |
| 2015/0151490 A1 | 6/2015 | Jonasson et al. |
| 2015/0165524 A1 | 6/2015 | Ljungblad et al. |
| 2015/0165525 A1 | 6/2015 | Jonasson |
| 2015/0174658 A1 | 6/2015 | Ljungblad |
| 2015/0174695 A1 | 6/2015 | Elfstroem et al. |
| 2015/0251249 A1 | 9/2015 | Fager |
| 2015/0273622 A1 | 10/2015 | Manabe |
| 2015/0283610 A1 | 10/2015 | Ljungblad et al. |
| 2015/0283613 A1 | 10/2015 | Backlund et al. |
| 2015/0290710 A1 | 10/2015 | Ackelid |
| 2015/0306819 A1 | 10/2015 | Ljungblad |
| 2016/0052056 A1 | 2/2016 | Fager |
| 2016/0052079 A1 | 2/2016 | Ackelid |
| 2016/0054115 A1 | 2/2016 | Snis |
| 2016/0054121 A1 | 2/2016 | Snis |
| 2016/0054347 A1 | 2/2016 | Snis |
| 2016/0059314 A1 | 3/2016 | Ljungblad et al. |
| 2016/0129501 A1 | 5/2016 | Loewgren et al. |
| 2016/0167160 A1 | 6/2016 | Hellestam |
| 2016/0167303 A1 | 6/2016 | Petelet |
| 2016/0202042 A1 | 7/2016 | Snis |
| 2016/0202043 A1 | 7/2016 | Snis |
| 2016/0211116 A1 | 7/2016 | Lock |
| 2016/0236279 A1 | 8/2016 | Ashton et al. |
| 2016/0279735 A1 | 9/2016 | Hellestam |
| 2016/0282848 A1 | 9/2016 | Hellestam |
| 2016/0303687 A1 | 10/2016 | Ljungblad |
| 2016/0307731 A1 | 10/2016 | Lock |
| 2016/0311021 A1 | 10/2016 | Elfstroem et al. |
| 2017/0080494 A1 | 3/2017 | Ackelid |
| 2017/0087661 A1 | 3/2017 | Backlund et al. |
| 2017/0106443 A1 | 4/2017 | Karlsson |
| 2017/0106570 A1 | 4/2017 | Karlsson |
| 2017/0136541 A1 | 5/2017 | Fager |
| 2017/0136542 A1 | 5/2017 | Nordkvist et al. |
| 2017/0173691 A1 | 6/2017 | Jonasson |
| 2017/0189964 A1 | 7/2017 | Backlund et al. |
| 2017/0227417 A1 | 8/2017 | Snis |
| 2017/0227418 A1 | 8/2017 | Snis |
| 2017/0246684 A1 | 8/2017 | Hellestam |
| 2017/0246685 A1 | 8/2017 | Hellestam |
| 2017/0259338 A1 | 9/2017 | Ackelid |
| 2017/0282248 A1 | 10/2017 | Ljungblad et al. |
| 2017/0341141 A1 | 11/2017 | Ackelid |
| 2017/0341142 A1 | 11/2017 | Ackelid |
| 2017/0348791 A1 | 12/2017 | Ekberg |
| 2017/0348792 A1 | 12/2017 | Fager |
| 2018/0009033 A1 | 1/2018 | Fager |
| 2018/0154444 A1 | 6/2018 | Jonasson |

FOREIGN PATENT DOCUMENTS

| | | |
|---|---|---|
| CN | 101635210 A | 1/2010 |
| CN | 201693176 U | 1/2011 |
| CN | 101607311 B | 9/2011 |
| CN | 203509463 U | 4/2014 |
| DE | 19952998 A1 | 5/2001 |
| DE | 20305843 U1 | 7/2003 |
| DE | 10235434 A1 | 2/2004 |
| DE | 102005014483 A1 | 10/2006 |
| DE | 202008005417 U1 | 8/2008 |
| DE | 102007018601 A1 | 10/2008 |
| DE | 102007029052 A1 | 1/2009 |
| DE | 102008012064 A1 | 9/2009 |
| DE | 102010041284 A1 | 3/2012 |
| DE | 102011105045 B3 | 6/2012 |
| DE | 102013210242 A1 | 12/2014 |
| EP | 0289116 A1 | 11/1988 |
| EP | 0322257 A2 | 6/1989 |
| EP | 0688262 A1 | 12/1995 |
| EP | 1358994 A1 | 11/2003 |
| EP | 1418013 A1 | 5/2004 |
| EP | 1466718 A2 | 10/2004 |
| EP | 1486318 A2 | 12/2004 |
| EP | 1669143 A1 | 6/2006 |
| EP | 1683593 A2 | 7/2006 |
| EP | 1721725 A1 | 11/2006 |
| EP | 1752240 A1 | 2/2007 |
| EP | 1952932 A2 | 8/2008 |

(56) References Cited

FOREIGN PATENT DOCUMENTS

| | | |
|---|---|---|
| EP | 2011631 A1 | 1/2009 |
| EP | 2119530 A1 | 11/2009 |
| EP | 2281677 A1 | 2/2011 |
| EP | 2289652 A1 | 3/2011 |
| EP | 2292357 A1 | 3/2011 |
| EP | 2832474 A1 | 2/2015 |
| FR | 2980380 A1 | 3/2013 |
| JP | H05-171423 A | 7/1993 |
| JP | 2003241394 A | 8/2003 |
| JP | 2003245981 | 9/2003 |
| JP | 2009006509 A | 1/2009 |
| SE | 524467 C2 | 8/2004 |
| WO | WO 1993/08928 A1 | 5/1993 |
| WO | WO 1996/012607 A1 | 5/1996 |
| WO | WO 1997/37523 A2 | 10/1997 |
| WO | WO 2001/081031 A1 | 11/2001 |
| WO | WO 2001/85386 A2 | 11/2001 |
| WO | WO 2002/008653 A1 | 1/2002 |
| WO | WO 2004/007124 A1 | 1/2004 |
| WO | WO 2004/043680 A2 | 5/2004 |
| WO | WO 2004/054743 A1 | 7/2004 |
| WO | WO 2004/056511 A1 | 7/2004 |
| WO | WO 2004/106041 A2 | 12/2004 |
| WO | WO 2004/108398 A1 | 12/2004 |
| WO | WO 2006/091097 A2 | 8/2006 |
| WO | WO 2006/121374 A1 | 11/2006 |
| WO | WO 2007/112808 A1 | 10/2007 |
| WO | WO 2007/147221 A1 | 12/2007 |
| WO | WO 2008/013483 A1 | 1/2008 |
| WO | WO 2008/057844 A1 | 5/2008 |
| WO | WO 2008/074287 A1 | 6/2008 |
| WO | WO 2008/125497 A1 | 10/2008 |
| WO | WO 2008/147306 A1 | 12/2008 |
| WO | WO 2009/000360 A1 | 12/2008 |
| WO | WO 2009/072935 A1 | 6/2009 |
| WO | WO 2009/084991 A1 | 7/2009 |
| WO | WO 2010/095987 A1 | 8/2010 |
| WO | WO 2010/125371 A1 | 11/2010 |
| WO | WO 2011/008143 A1 | 1/2011 |
| WO | WO 2011/011818 A1 | 2/2011 |
| WO | WO 2011/030017 A1 | 3/2011 |
| WO | WO 2011/060312 A2 | 5/2011 |
| WO | WO 2012/102655 A1 | 8/2012 |
| WO | WO 2013/092997 A1 | 6/2013 |
| WO | WO 2013/098050 A1 | 7/2013 |
| WO | WO 2013/098135 A1 | 7/2013 |
| WO | WO 2013/159811 A1 | 10/2013 |
| WO | WO 2013/167194 A1 | 11/2013 |
| WO | WO 2013/178825 A2 | 12/2013 |
| WO | WO 2014/071968 A1 | 5/2014 |
| WO | WO 2014/092651 A1 | 6/2014 |
| WO | WO 2014/095200 A1 | 6/2014 |
| WO | WO 2014/095208 A1 | 6/2014 |
| WO | WO 2014/195068 A1 | 12/2014 |
| WO | WO 2015/032590 A2 | 3/2015 |
| WO | WO 2015/091813 A1 | 6/2015 |
| WO | WO 2015/120168 A1 | 8/2015 |
| WO | WO 2015/142492 A1 | 9/2015 |

OTHER PUBLICATIONS

Gibson, D.W., et al., "Additive Manufacturing Technologies: Rapid Prototyping to Direct Digital Manufacturing", 2010, pp. 126-129, Springer, New York.
Motojima, Seiji, et al., "Chemical Vapor Growth of LaB6 Whiskers and Crystals Having a Sharp Tip", Journal of Crystal Growth, vol. 44, No. 1, Aug. 1, 1978 (Aug. 1, 1978), pp. 106-109.
Cheah, Chi-Mun, et al., "Automatic Algorithm for Generating Complex Polyhedral Scaffold Structure for Tissue Engineering", Tissue Engineering, 2004, pp. 595-610, vol. 10, No. 3/4, XP002691483.
Guibas, Leonidas J., et al., "Randomized Incremental Construction of Delaunay and Voronoi Diagrams", Algorithmica, Jun. 1992, pp. 381-413, vol. 7, Issue 1-6, Springer-Verlag, New York.
United States Patent and Trademark Office, Notice of Allowance for U.S. Appl. No. 15/190,899, dated Aug. 17, 2016, 22 pages, U.S.A.
United States Patent and Trademark Office, Notice of Allowance for U.S. Appl. No. 14/443,015, dated May 18, 2017, 8 pages, U.S.A.
United States Patent and Trademark Office, Notice of Allowance for U.S. Appl. No. 14/973,230, dated May 30, 2017, 27 pages, U.S.A.
United States Patent and Trademark Office, Office Action for U.S. Appl. No. 14/621,209, dated May 23, 2017, 34 pages, U.S.A.
United States Patent and Trademark Office, Office Action for U.S. Appl. No. 14/636,607, dated Jun. 1, 2017, 19 pages, U.S.A.
United States Patent and Trademark Office, Office Action for U.S. Appl. No. 14/618,748, dated Jun. 2, 2017, 18 pages, U.S.A.
United States Patent and Trademark Office, Office Action for U.S. Appl. No. 15/371,637, dated May 30, 2017, 8 pages, U.S.A.
United States Patent and Trademark Office, Office Action for U.S. Appl. No. 15/466,212, dated May 31, 2017, 17 pages, U.S.A.
Weigel, T.H., et al., "Design and Preparation of Polymeric Scaffolds for Tissue Engineering," Expert Rev. Med. Devices, 2006, pp. 835-851, vol. 3, No. 6, XP002691485.
Yang, et al., "The Design of Scaffolds for Use in Tissue Engineering, Part II, Rapid Prototyping Techniques", Tissue Engineering, 2002, pp. 1-11, vol. 8, No. 1, XP002691484.
Written Opinion and International Search Report for application PCT/EP2016/050787 date Apr. 4, 2016 (12 pages).
Written Opinion and International Search Report for application PCT/EP2016/050742 date Jun. 20, 2016 (21 pages).

* cited by examiner

METHOD AND DEVICE FOR CHARACTERIZING AN ELECTRON BEAM

CROSS-REFERENCE TO RELATED APPLICATIONS

This application is a divisional patent application of U.S. Nonprovisional patent application Ser. No. 14/973,230, filed Dec. 17, 2015, which claims priority to and the benefit of U.S. Provisional Patent Application Ser. No. 62/106,089, filed Jan. 21, 2015, the contents of both of which as are hereby incorporated by reference in their entirety.

BACKGROUND

Technical Field

The present invention relates to an improved method for characterizing an electron beam.

Related Art

Freeform fabrication or additive manufacturing is a method for forming three-dimensional articles through successive fusion of chosen parts of powder layers applied to a work plate. A method and apparatus according to this technique is disclosed in U.S. Pat. No. 7,713,454.

Such an apparatus may comprise a work table on which the three-dimensional article is to be formed, a powder dispenser, arranged to lay down a thin layer of powder on the work table for the formation of a powder bed, an energy beam source for delivering an energy beam spot to the powder whereby fusion of the powder takes place, elements for control of the energy beam spot over the powder bed for the formation of a cross section of the three-dimensional article through fusion of parts of the powder bed, and a controlling computer, in which information is stored concerning consecutive cross sections of the three-dimensional article. A three-dimensional article is formed through consecutive fusions of consecutively formed cross sections of powder layers, successively laid down by the powder dispenser.

In order to melt the powder material at specific locations there is a need to have an accurate control of the energy beam, such as deflection speed, position, and shape.

Presently an electron beam is optically calibrated using the glow of the metal. Such calibration method has several drawbacks. Firstly it is time consuming since it takes some time until the metal starts to glow. Secondly it requires a relatively high beam power for starting the metal to glow. Thirdly, the metal which has been glowing may have been locally damaged or at least locally changed its material characteristics. And lastly, the optical equipment used for the calibration may get metallised during the calibration process or in a later process step. Furthermore there is not a straightforward relationship between the glow of the material and the power of the electron beam.

There is thus a need in the art for a simple and efficient method for calibrating and/or verifying the characteristics of an electron beam.

BRIEF SUMMARY

An object of the present invention is to provide a method for calibrating/verifying an electron beam which eliminates or at least reduces the above mentioned problems. The abovementioned object is achieved via the features recited in the claims herein.

In a first aspect of the invention it is provided a method for calibrating an electron beam, the method comprising the steps of: arranging a patterned aperture resolver having at least one opening in front of at least one X-ray detector, where the at least one opening is facing towards the at least one X-ray detector, arranging a patterned aperture modulator between the patterned aperture resolver and a substrate and at a predetermined distance from the patterned aperture resolver and the substrate, where the patterned aperture modulator having a plurality of openings in at least a first direction, scanning an electron beam in at least a first direction on the substrate for generating X-rays to be received by the at least one X-ray detector, detecting the X-rays emanating from the surface produced by the scanning electron beam with the patterned aperture modulator and the patterned aperture resolver, wherein a map of position, size and shape of the electron beam is achieved by mapping an intensity modulation of the X-ray signal from the detector with settings for controlling the electron beam, adjusting the settings for controlling the electron beam if the shape and/or size of the electron beam is deviating more than a predetermined value from a corresponding reference beam shape and/or a reference beam size, and repeating step c-e until the shape and/or size of the electron beam is deviating less than a predetermined value from the reference beam shape and/or reference beam size.

An exemplary advantage of this method is that the calibration of the electron beam can be performed at any moment. There may be no limitation as to whether the calibration power maybe too high or too low, since the scanning speed may be sufficiently high for not affecting the material surface from which the X-rays are emanating from. Another advantage is that this kind of calibration method may be insensitive to possible material deposition since the deposition may be collected by an appropriate shielding plate in front of the detector.

In another example embodiment the method further comprising the step of repeating step c-f for different beam powers. A non-limiting and exemplary advantage of at least this embodiment is that a full calibration for all beam powers can be done without risking any locally damaged or locally changed material characteristics. Another advantage of this embodiment is that one may choose which type of pattern, 1- or 2-dimensional, to use. Obviously a 1-dimensional pattern may only verify the deflection speed in 1-dimension if not the 1-dimensional pattern is rotated and reused several times on the work table.

In still another example embodiment wherein the settings are input signals to a beam shaping and positioning unit. The beam shaping and positioning unit may comprise at least one deflection coil, at least one focus coil and at least one astigmatism coil. A non-limiting and exemplary advantage of at least this embodiment is that the size and shape of the electron beam may be calibrated by scanning the beam in at least two different directions.

In another aspect of the present invention it is provided a device for detecting X-rays radiated out of a substrate surface, the device comprising at least one first X-ray detector, a patterned aperture resolver and a patterned aperture modulator, the patterned aperture resolver with at least one opening facing towards the X-ray detector is arranged in front of the X-ray detector, the patterned aperture modulator is provided between the patterned aperture resolver and the substrate at a predetermined distance from the patterned aperture resolver and the substrate, where the patterned aperture modulator having a plurality of openings in at least a first direction, wherein the x-rays from the surface is intensity modulated with the patterned aperture modulator and patterned aperture resolver before being detected by the X-ray detector.

A non-limiting and exemplary advantage of at least this embodiment is that such device may be used for calibrating an electron beam in any electron beam equipment such as: electron beam welding equipment, electron beam additive manufacturing equipment or a Scanning Electron Microscope.

In an example embodiment the openings in the patterned aperture modulator and/or the patterned aperture resolver is arranged in a 1-dimensional or 2-dimensional pattern. A non-limiting and exemplary advantage of at least this embodiment is that the modulator structure may be designed for calibration/verification of the electron beam in one or several directions.

In still another example embodiment of the present invention the 1-dimensional or 2-dimensional pattern is periodic or non-periodic. A non-limiting and exemplary advantage of a non-periodic pattern is that it may make the central peak of X-ray signal on the detector stand out more clearly among the side lobes of the X-ray signal on the same detector. This may be more important in the case where a very large number of openings are used in the patterned aperture modulator and/or the patterned aperture resolver.

In still another example embodiment of the present invention an opening at a first position of the patterned aperture modulator and/or patterned aperture resolver is arranged with a first type of micro-pattern and an opening at a second position of the patterned aperture modulator and/or patterned aperture resolver is arranged with a second type of micro-pattern.

A non-limiting and exemplary advantage of at least this embodiment is that from a single scan direction one may receive more information about the beam characteristics.

In still another example embodiment of the present invention the first type of micro-pattern is a plurality of slots in a first direction and the second type of micro-pattern is a plurality of slots in a second direction. A non-limiting and exemplary advantage of at least this embodiment is that the X-ray signal strength may be improved while at the same time maintaining the X-ray signal resolution.

In still another example embodiment of the present invention a base material of the patterned aperture modulator and the patterned aperture resolver is designed so as to shield X-ray radiation. A non-limiting and exemplary advantage of at least this embodiment is that X-ray radiation may only reach the detector via the openings in the patterned aperture modulator and the patterned aperture resolver.

In still another example embodiment of the present invention a protection window is arranged between the X-ray detector and the patterned aperture resolver or between the patterned aperture resolver and patterned aperture modulator or between the substrate and patterned aperture modulator. A non-limiting and exemplary advantage of at least this embodiment is that part of or the full detector may be arranged outside a vacuum chamber. Another advantage of this embodiment is that the detector may be insensitive for material deposition.

In still another example embodiment the worktable may be provided with a reference pattern. A non-limiting and exemplary advantage of at least this embodiment is that the distance between the patterned aperture modulator and the substrate and the patterned aperture modulator and the patterned aperture resolver may be unknown prior to starting the calibration/verification process. This reference pattern may determine the scale of the detected signals.

In still another example embodiment of the present invention the patterned aperture resolver is arranged at a distance from the X-ray detector. A non-limiting and exemplary advantage of at least this embodiment is that the arrangement of the detector relative to the patterned aperture resolver is relatively independent on the functionality of the device.

In another example embodiment of the present invention the patterned aperture resolver is replaced by a patterned detector. A non-limiting and exemplary advantage of at least this embodiment is that any alignment procedure when manufacturing the device of the patterned aperture resolver with the patterned aperture modulator and the detector is eliminated.

In still another example embodiment of the present invention the device further comprising at least one second X-ray detector arranged with a patterned aperture resolver and a patterned aperture modulator, the patterned aperture resolver with at least one opening facing towards the at least one second X-ray detector is arranged in front of the at least one second X-ray detector, the patterned aperture modulator is provided between the patterned aperture resolver and the substrate at a predetermined distance from the patterned aperture resolver and the substrate, where the patterned aperture modulator having a plurality of openings in at least a first direction, where the x-rays from the surface is intensity modulated with the patterned aperture modulator and the patterned aperture resolver before being detected by the at least one second X-ray detector, wherein the at least one first X-ray detector and the at least one second X-ray detector are arranged at a predetermined distance from each other for detecting height variations in a surface of the substrate.

A non-limiting and exemplary advantage of at least this embodiment is that the substrate surface topography may be detected at the same time as calibrating/verifying the electron beam.

In yet another example embodiment of the present invention the first and second x-ray detectors are arranged in a plane in parallel with the substrate and the height information is determined by triangulation. A non-limiting and exemplary advantage of at least this embodiment is that the time difference between receiving X-rays signals by the first and second detectors and the order in which the first and second x-ray detectors received the x-ray signal may give an indication of the topography if the surface. A longer time interval between X-rays emanating from the same position indicates a larger relative height difference. The order of receiving the signals by the first and second detectors may give an indication of an elevation or a cavity from a nominal surface height. At the nominal surface the first and second detectors are receiving the X-ray signal simultaneously.

In yet another example embodiment the at least one first and the at least one second detector are arranged in a single unit. A non-limiting and exemplary advantage of at least this embodiment is that the two detectors may already be calibrated to each other.

In still another example embodiment the at least one first and the at least one second detectors are aranges in a separate units. A non-limiting and exemplary advantage of at least this embodiment is that the first and second detectors may be arranged to an electron beam equipment where there is sufficient space.

In another aspect of the present invention it is provided a method for forming a 3-dimensional article through successive fusion of parts of a powder bed, which parts correspond to successive cross sections of the 3-dimensional article, the method comprising the steps of: providing a model of the 3-dimensional article, applying a first powder layer on a work table, directing an electron beam from an electron beam source over the work table, the directing of the electron beam causing the first powder layer to fuse in first selected locations according to the model, so as to form a first part of a cross section of the three dimensional article, and intensity modulating X-rays from the powder layer or from a clean work table with a patterned aperture modulator and a patterned aperture resolver, wherein a verification of at least one of a size, position, scan speed and/or shape of the electron beam is achieved by comparing detected intensity modulated X-ray signals with saved reference values. A non-limiting and exemplary advantage of at least this embodiment is that the manufacture of three-dimensional articles may be further improved because a verification and adjustment of the electron beam may be performed at any given moment during the manufacture.

In still another aspect of the present invention it is provided a method for verifying an electron beam, the method comprising the steps of: arranging a patterned aperture resolver having at least one opening in front of at least one X-ray detector, where the at least one opening is facing towards the at least one X-ray detector, arranging a patterned aperture modulator between the patterned aperture resolver and a substrate and at a predetermined distance from the patterned aperture resolver and the substrate, where the patterned aperture modulator having a plurality of openings in at least a first direction, scanning an electron beam in at least a first direction on the substrate for generating X-rays to be received by the at least one X-ray detector, and verifying at least one of a position, size and shape of the electron beam by comparing a detected intensity modulation of the X-ray signal by the detector with corresponding reference values, wherein the electron beam is said to be verified if a deviation of the detected signal and the reference value is smaller than a predetermined value. A non-limiting and exemplary advantage of at least this method is that the verification of any electron beam may be performed for any kind of electron beam equipment.

The calibrating and/or the verification methods described herein above may be used with the additive manufacturing apparatus in which the energy beam spot is used for fusing power material layer-wise for forming three-dimensional articles.

In another aspect of the present invention it is provided a method for calibrating an electron beam, the method comprising the steps of: positioning a patterned aperture resolver having at least one opening in front of at least one X-ray detector, such that the at least one opening is facing towards the at least one X-ray detector; positioning a patterned aperture modulator between the patterned aperture resolver and a substrate and at a predetermined distance from the patterned aperture resolver and the substrate, where the patterned aperture modulator has a plurality of openings oriented in at least a first direction; scanning an electron beam in at least a first direction on the substrate for generating X-rays to be received by the at least one X-ray detector; detecting the X-rays emanating from the surface produced by the scanning electron beam with the patterned aperture modulator and the patterned aperture resolver, wherein a map of position, size and shape of the electron beam is achieved by mapping an intensity modulation of the X-ray signal from the detector with settings for controlling the electron beam; adjusting the settings for controlling the electron beam if at least one of the shape or the size of the electron beam is deviating more than a predetermined value from at least one of a corresponding reference beam shape or a reference beam size; and repeating the scanning, detecting, and adjusting steps until at least one of the shape or the size of the electron beam is deviating less than a predetermined value from at least one of the reference beam shape or the reference beam size.

In another aspect of the present invention it is provided a device for detecting X-rays radiated out of a substrate surface, the device comprising: at least one first X-ray detector; a patterned aperture resolver; and a patterned aperture modulator, wherein: the patterned aperture resolver includes at least one opening facing towards the X-ray detector and is positioned in front of the X-ray detector; the patterned aperture modulator is positioned between the patterned aperture resolver and the substrate at a predetermined distance from the patterned aperture resolver and the substrate, where the patterned aperture modulator has a plurality of openings in at least a first direction; and the x-rays from the surface are intensity modulated with the patterned aperture modulator and patterned aperture resolver before being detected by the X-ray detector.

In another aspect of the present invention it is provided a program element configured and arranged when executed on a computer to implement a method for calibrating an electron beam, the method comprising the steps of: arranging a patterned aperture resolver having at least one opening in front of at least one X-ray detector, where the at least one opening is facing towards the at least one X-ray detector; arranging a patterned aperture modulator between the patterned aperture resolver and a substrate and at a predetermined distance from the patterned aperture resolver and the substrate, where the patterned aperture modulator having a plurality of openings in at least a first direction; scanning an electron beam in at least a first direction on the substrate for generating X-rays to be received by the at least one X-ray detector; intensity modulating the X-rays emanating from the surface with the patterned aperture modulator and patterned aperture resolver, wherein a map of position, size and shape of the electron beam is achieved by mapping an intensity modulated X-ray signal from the detector with settings for controlling the electron beam; adjusting the settings for controlling the electron beam if the shape and/or size of the electron beam is deviating more than a predetermined value from a corresponding reference beam shape and/or a reference beam size; and repeating the scanning, intensity modulating, and adjusting steps until the shape of the electron beam is deviating less than a predetermined value from a reference beam shape and/or size.

In another aspect of the present invention it is provided a non-transitory computer program product comprising at least one computer-readable storage medium having computer-readable program code portions embodied therein, the computer-readable program code portions comprising: an executable portion configured for scanning an electron beam in at least a first direction on the substrate for generating X-rays to be received by the at least one X-ray detector; an executable portion configured for intensity modulating the X-rays emanating from the surface with a patterned aperture modulator and a patterned aperture resolver, wherein a map of position, size and shape of the electron beam is achieved by mapping an intensity modulated X-ray signal from the detector with settings for controlling the electron beam; an executable portion configured for adjusting the settings for controlling the electron beam if the shape and/or size of the electron beam is deviating more than a predetermined value from a corresponding reference beam shape and/or a reference beam size; and an executable portion configured for repeating the scanning, intensity modulating, and adjusting steps until the shape of the electron beam is deviating less than a predetermined value from a reference beam shape and/or size.

In another aspect of the present invention it is provided a method for verifying an electron beam, the method comprising the steps of: arranging a patterned aperture resolver having at least one opening in front of at least one X-ray detector, where the at least one opening is facing towards the at least one X-ray detector; arranging a patterned aperture modulator between the patterned aperture resolver and a substrate and at a predetermined distance from the patterned aperture resolver and the substrate, where the patterned aperture modulator having a plurality of openings in at least a first direction; scanning an electron beam in at least a first direction on the substrate for generating X-rays to be received by the at least one X-ray detector; and verifying at least one of a position, size and shape of the electron beam by comparing a detected intensity modulation of the X-ray signal by the detector with corresponding reference values, wherein the electron beam is said to be verified if a deviation of the detected signal and the reference value is smaller than a predetermined value.

In another aspect of the present invention it is provided a method for forming a 3-dimensional article through successive fusion of parts of a powder bed, which parts correspond to successive cross sections of the 3-dimensional article, the method comprising the steps of: providing a model of the 3-dimensional article; applying a first powder layer on a work table; directing an electron beam from an electron beam source over the work table, the directing of the electron beam causing the first powder layer to fuse in first selected locations according to the model, so as to form a first part of a cross section of the three dimensional article, and intensity modulating X-rays from the powder layer or from a clean work table with a patterned aperture modulator and a patterned aperture resolver, wherein a verification of at least one of a size, position, scan speed and/or shape of the electron beam is achieved by comparing detected intensity modulated X-ray signals with saved reference values.

In another aspect of the present invention it is provided a program element configured and arranged when executed on a computer to implement a method for verifying an electron beam, the method comprising the steps of: arranging a patterned aperture resolver having at least one opening in front of at least one X-ray detector, where the at least one opening is facing towards the at least one X-ray detector; arranging a patterned aperture modulator between the patterned aperture resolver and a substrate and at a predetermined distance from the patterned aperture resolver and the substrate, where the patterned aperture modulator having a plurality of openings in at least a first direction; scanning an electron beam in at least a first direction on the substrate for generating X-rays to be received by the at least one X-ray detector; and verifying at least one of a position, size and shape of the electron beam by comparing a detected intensity modulation of the X-ray signal by the detector with corresponding reference values, wherein the electron beam is said to be verified if a deviation of the detected signal and the reference value is smaller than a predetermined value.

In another aspect of the present invention it is provided a non-transitory computer program product comprising at least one computer-readable storage medium having computer-readable program code portions embodied therein, the computer-readable program code portions comprising: an executable portion configured for arranging a patterned aperture resolver having at least one opening in front of at least one X-ray detector, where the at least one opening is facing towards the at least one X-ray detector; an executable portion configured for arranging a patterned aperture modulator between the patterned aperture resolver and a substrate and at a predetermined distance from the patterned aperture resolver and the substrate, where the patterned aperture modulator having a plurality of openings in at least a first direction; an executable portion configured for scanning an electron beam in at least a first direction on the substrate for generating X-rays to be received by the at least one X-ray detector; and an executable portion configured for verifying at least one of a position, size and shape of the electron beam by comparing a detected intensity modulation of the X-ray signal by the detector with corresponding reference values, wherein the electron beam is said to be verified if a deviation of the detected signal and the reference value is smaller than a predetermined value.

Herein and throughout, where an exemplary embodiment is described or an advantage thereof is identified, such are considered and intended as exemplary and non-limiting in nature, so as to not otherwise limit or constrain the scope and nature of the inventive concepts disclosed.

BRIEF DESCRIPTION OF THE FIGURES

The invention will be further described in the following, in a non-limiting way with reference to the accompanying drawings. Same characters of reference are employed to indicate corresponding similar parts throughout the several figures of the drawings.

DETAILED DESCRIPTION OF VARIOUS EMBODIMENTS

Various example embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein. Rather, these embodiments are provided so that this disclosure will satisfy applicable legal requirements. Unless otherwise defined, all technical and scientific terms used herein have the same meaning as commonly known and understood by one of ordinary skill in the art to which the invention relates. The term "or" is used herein in both the alternative and conjunctive sense, unless otherwise indicated. Like numbers refer to like elements throughout.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g. of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of a charged particle beam can include an electron gun, a linear accelerator and so on.

Figure 3:
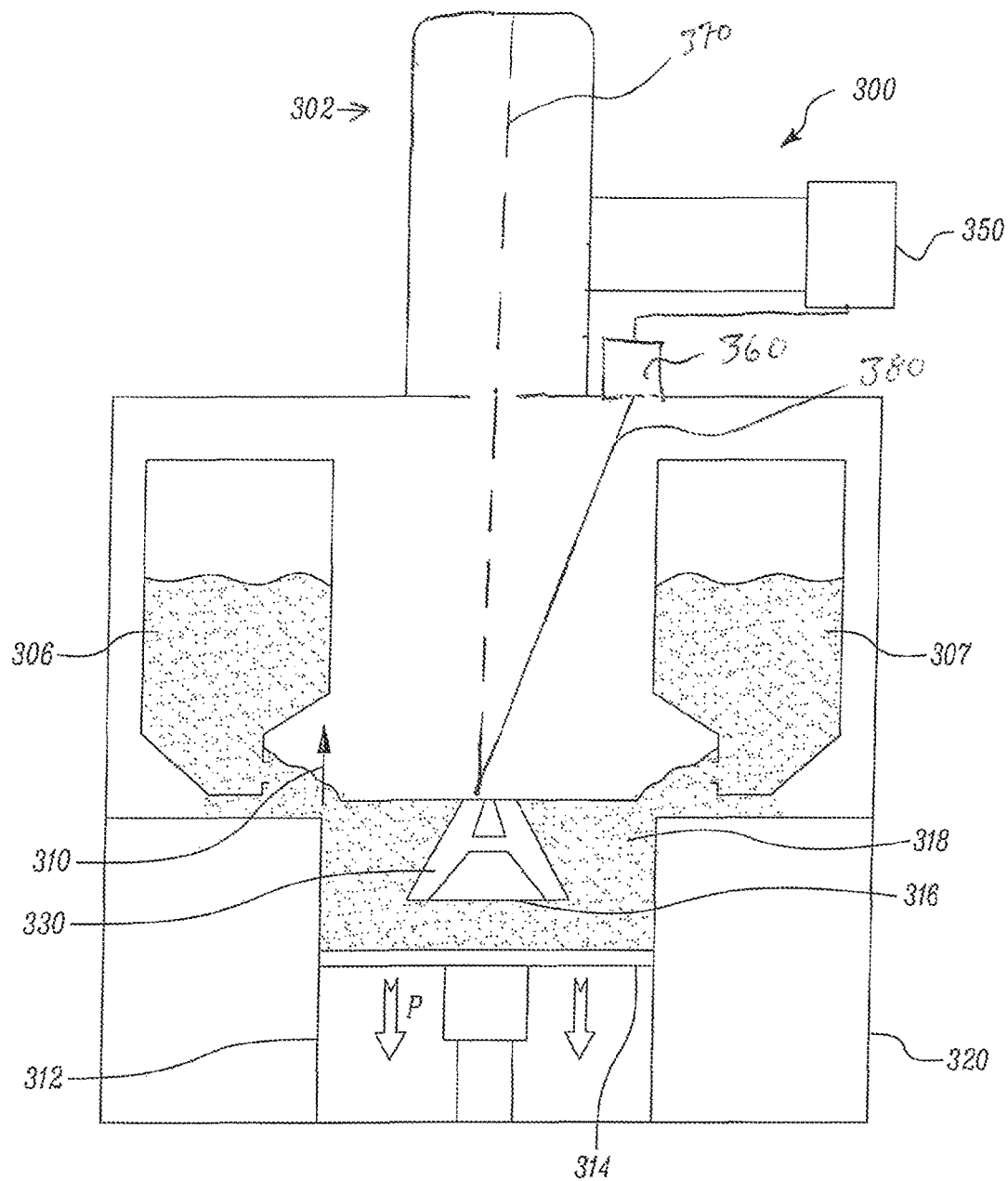
FIG. 3 depicts an apparatus in which the inventive device and method may be implemented.

FIG. 3 depicts an example embodiment of a freeform fabrication or additive manufacturing apparatus 300 in which the inventive calibration/verification method and calibration/verification device may be implemented. The inventive calibration/verification method and device may also be implemented in a Scanning Electron Microscopy (SEM), an electron welding equipment or other scanning electron beam equipment.

The apparatus 300 comprising an electron gun 302; two powder hoppers 306, 307; a start plate 316; a build tank 312; a powder distributor 310; a build platform 314; a vacuum chamber 320, a control unit 350 and a calibration device 360.

The vacuum chamber 320 is capable of maintaining a vacuum environment by means of a vacuum system, which system may comprise a turbomolecular pump, a scroll pump, an ion pump and one or more valves which are well known to a skilled person in the art and therefore need no further explanation in this context. The vacuum system may be controlled by a control unit 350.

The electron gun 302 is generating an electron beam 370 which may be used for melting or fusing together powder material 318 provided on the start plate 316. The electron gun 302 may be provided in the vacuum chamber 320. The control unit 350 may be used for controlling and managing the electron beam emitted from the electron beam gun 302. At least one focusing coil (not shown), at least one deflection coil (not shown) and an electron beam power supply (not shown) may be electrically connected to the control unit 350. In an example embodiment of the invention the electron gun 302 generates a focusable electron beam with an accelerating voltage of about 60 kV and with a beam power in the range of 0-10 kW. The pressure in the vacuum chamber may be in the range of $1\times10^{-3}$-$1\times10^{-6}$ mBar when building the three-dimensional article by fusing the powder layer by layer with the energy beam.

The powder hoppers 306, 307 comprise the powder material to be provided on the start plate 316 in the build tank 312. The powder material may for instance be pure metals or metal alloys such as titanium, titanium alloys, aluminum, aluminum alloys, stainless steel, Co—Cr—W alloy, etc.

The powder distributor 310 is arranged to lay down a thin layer of the powder material on the start plate 316. During a work cycle the build platform 314 will be lowered successively in relation to the ray gun after each added layer of powder material. In order to make this movement possible, the build platform 314 is in one embodiment of the invention arranged movably in vertical direction, i.e., in the direction indicated by arrow P. This means that the build platform 314 starts in an initial position, in which a first powder material layer of necessary thickness has been laid down on the start plate 316. A first layer of powder material may be thicker than the other applied layers. The reason for starting with a first layer which is thicker than the other layers is that one does not want a melt-through of the first layer onto the start plate. The build platform is thereafter lowered in connection with laying down a new powder material layer for the formation of a new cross section of a three-dimensional article. Means for lowering the build platform 314 may for instance be through a servo engine equipped with a gear, adjusting screws etc.

A model of the three dimensional article may be generated via a CAD (Computer Aided Design) tool.

After a first layer is finished, i.e., the fusion of powder material for making a first layer of the three-dimensional article, a second powder layer is provided on the work table 316. The second powder layer is preferably distributed according to the same manner as the previous layer. However, there might be alternative methods in the same additive manufacturing machine for distributing powder onto the work table. For instance, a first layer may be provided by means of a first powder distributor, a second layer may be provided by another powder distributor. The design of the powder distributor is automatically changed according to instructions from the control unit. A powder distributor in the form of a single rake system, i.e., where one rake is catching powder fallen down from both a left powder hopper 306 and a right powder hopper 307, the rake as such can change design.

After having distributed the second powder layer on the work table 316, the energy beam is directed over the work table causing the second powder layer to fuse in selected locations to form a second cross section of the three-dimensional article. Fused portions in the second layer may be bonded to fused portions of the first layer. The fused portions in the first and second layer may be melted together by melting not only the powder in the uppermost layer but also remelting at least a fraction of a thickness of a layer directly below the uppermost layer.

Figure 1:
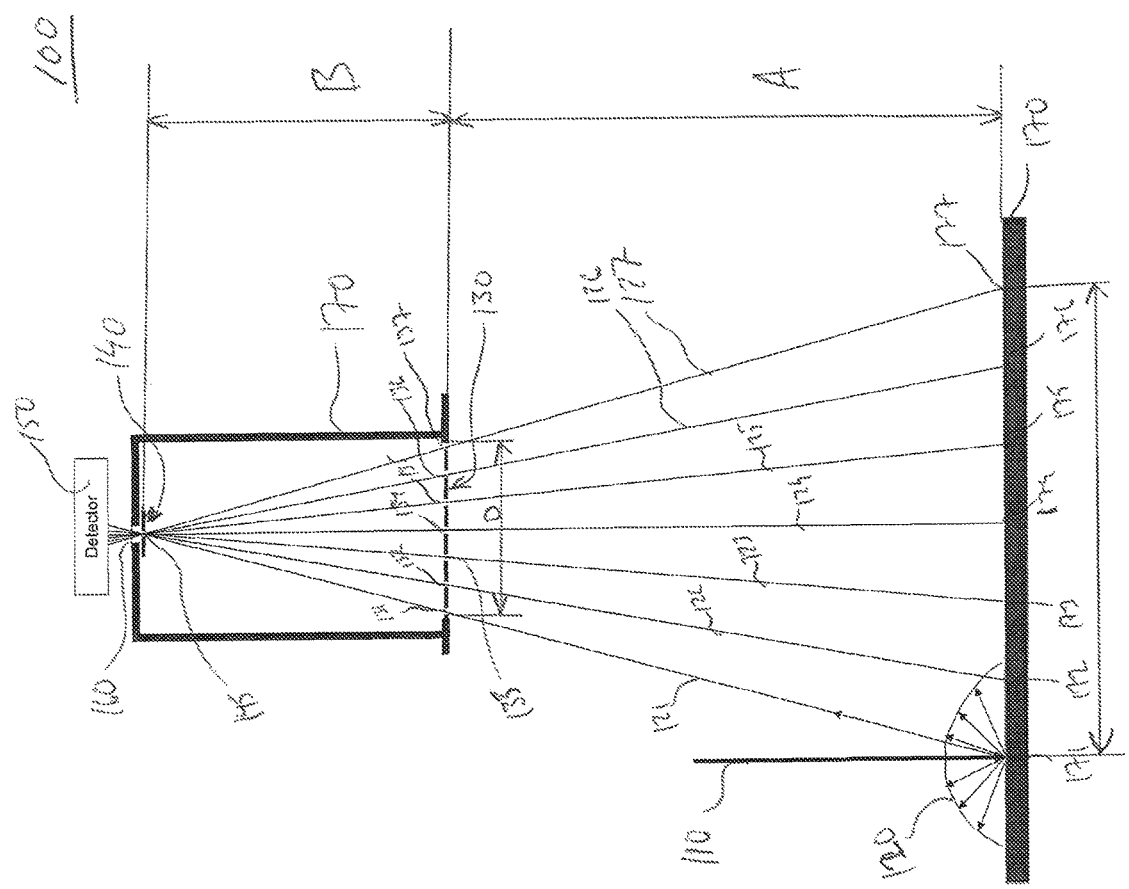
FIG. 1 depicts a schematic side view of a first example embodiment of a device for calibrating/verifying an electron beam.

FIG. 1 depicts a schematic side view of a first example embodiment of a device 100 for calibrating/verifying an electron beam 110. The device 100 comprises a modulator patterned aperture 130, a resolver patterned aperture 140 and at least one X-ray detector 150.

The modulator patterned aperture 130 is provided at a predetermined distance B from the resolver patterned aperture 140. The modulator patterned aperture 130 comprises a plurality of openings 131-137. The openings may be provided in a regular pattern or irregular pattern. The dimension of the openings is in the range of 1-10 000 µm. The openings may have a circular shape, rectangular shape or a slit shape. The openings may be arranged in 1-dimension or 2-dimensions.

Different openings of the patterned aperture 130 may be provided with different types of micro-pattern. A first opening may have a first type of micro-pattern and a second opening may have a second type of micro-pattern. The first type of micro pattern may be a plurality of slits in a first direction. The second type of micro-pattern may be a plurality of slits in a second direction.

The resolver patterned aperture 140 comprises at least one opening 145. The at least one opening 145 may have a dimension in the range of 1-10 000 µm. The at least one opening 145 may have a circular shape, rectangular shape or a slit shape.

In case of a plurality of openings in the resolver patterned aperture 140, the openings may be arranged in 1-dimension or 2-dimensions.

An opening in the resolver patterned aperture 140 may be provided with a micro pattern. The micro pattern may be a 1 dimensional or 2-dimensional pattern of circular, rectangular or slit shaped openings.

Different openings of the resolver patterned aperture 140 may be provided with different types of micro-pattern. A first opening may have a first type of micro-pattern and a second opening may have a second type of micro-pattern. The first type of micro pattern may be a plurality of slits in a first direction. The second type of micro-pattern may be a plurality of slits in a second direction.

The modulator patterned aperture 130 may be provided at a predetermined distance A from a substrate 170. In case the distance A is unknown, a reference pattern may be provided on the substrate 170 for achieving a correct scale of the distance between different detected positions on the substrate 170. In case the distance A is well defined, the reference pattern may become unnecessary since the scale is determined by the distances A, B and the dimension of the modulator patterned aperture 130 and the resolver patterned aperture 140. Distance B may be between 100-500 mm. Distance A may be 300-1000 mm. Distance D may be 10-100 mm and distance C may be 100-1000 mm.

An electron beam impinging on the substrate 170 will create X-ray radiation 120 radiating in all backward directions, i.e., in a direction out of the top surface of the substrate 170 into the ambient environment (vacuum chamber). This backward radiation is illustrated in FIG. 1 with small arrows in all direction around the first position 171 of the substrate 170 where the electron beam 110 is illustrated to impinge.

X-rays emanating from the first position 171 of the substrate 170 within a small angle interval is allowed to pass through a first opening 131 in the modulator patterned aperture 130 via the at least one opening 145 in the resolver patterned aperture 140 to the X-ray detector 150.

By moving the electron beam to a second position 172 of the substrate 170, X-rays emanating from the second position 172 of the substrate 170 within a small angle interval is allowed to pass through a second opening 132 in the modulator patterned aperture 130 via the at least one opening 145 in the resolver patterned aperture 140 to the X-ray detector 150.

In the same manner X-rays emanating from the third to the seventh position 173-177 on the substrate 170 are allowed to reach the X-ray detector 150 via the patterned aperture resolver 140 and a corresponding opening 133-137 of the patterned aperture modulator 130.

The electron beam position may be calibrated by detecting the modulated X-ray signal by the X-ray detector from at least two different positions 171-177 on the substrate 170. If the distance A is known and the distance between individual openings in the patterned aperture modulator 130 prior to the calibration process, the detected x-rays in combination with the setting of a beam shaping and positioning unit will determine the actual position of the electron beam.

The beam shaping and positioning unit may comprise at least one deflection coil, at least one focus coil and at least one astigmatism soil.

The scan speed may be determined by detecting the time between two predetermined signals emanating from two different positions 131-137 on the patterned aperture modulator 130. If the deflecting coil is provided with a constant signal and since the distance between individual openings in the patterned aperture modulator is known, the scan speed may easily be calculated.

The size and shape of the electron beam may be determined by analyzing the intensity modulated signal. As the electron beam is deflected on the substrate the X-rays from the substrate will more or less be detected by a predetermined opening in the patterned aperture modulator and a predetermined opening in the patterned aperture resolver. Information about the electron beam size and shape may be determined from the intensity modulated signal as it passes over an edge of the opening. The time duration an X-ray signal is detected by a predetermined position on the detector may be proportional to the size of the electron beam spot in the deflection direction. In order to determine a size and shape of the electron beam spot in another direction the deflection direction has to be changed. By analyzing the x-ray signal on a predetermined position on the detector for at least two deflection directions, one is provided with information of the beam size and shape in the two directions. By using more deflection directions the accuracy of the beam shape may be improved.

Figure 7:
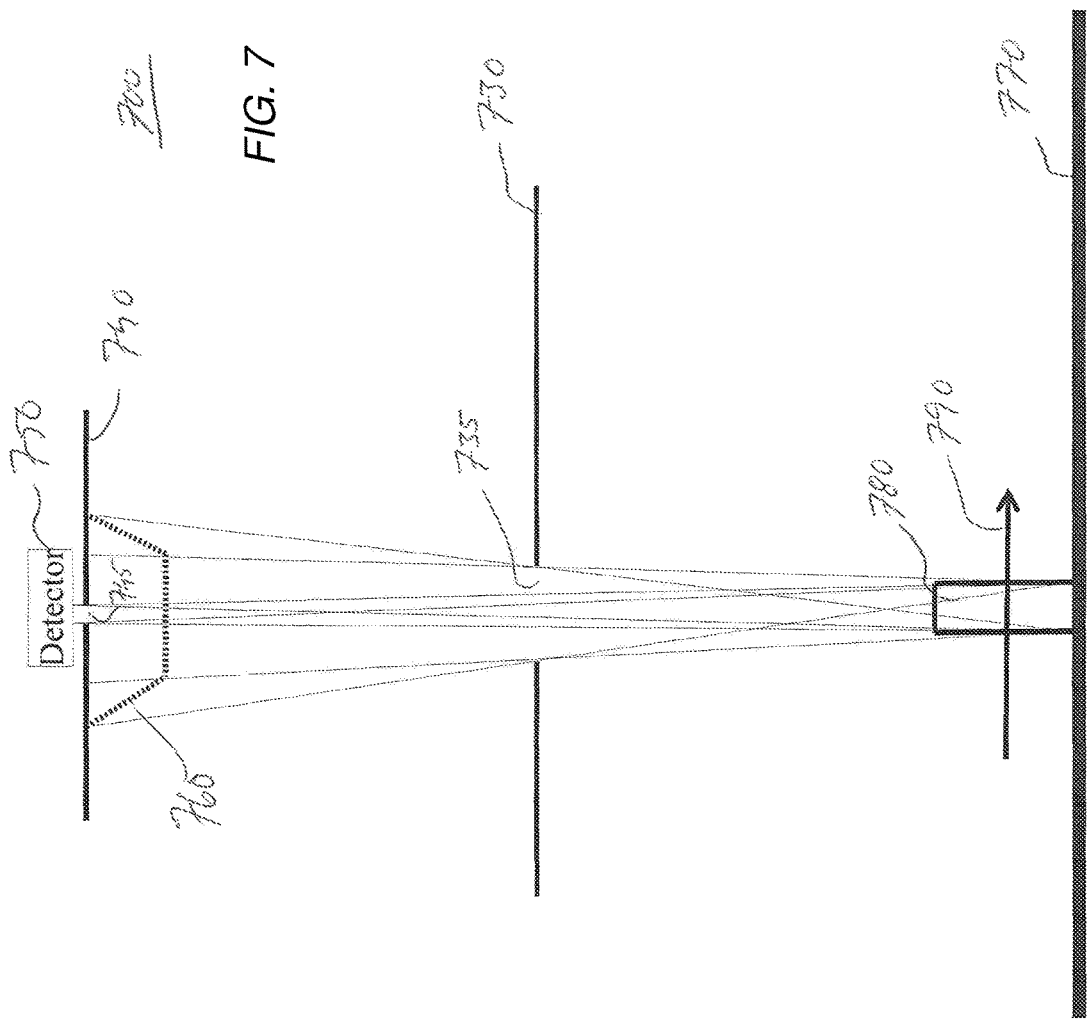
FIG. 7 depicts a schematic side view of how the size and shape of an electron beam may be calibrated/verified with an X-ray detector a patterned aperture resolver and a patterned aperture modulator.

FIG. 7 depicts a schematic side view of how the size and shape of an electron beam may be calibrated/verified with an X-ray detector, a patterned aperture resolver and a patterned aperture modulator. The electron beam in this illustration is assumed to have a rectangular shape. Obviously any desired shape of the electron beam may be used but this rectangular shape is used for simplifying the illustration only. As a rectangular beam is scanned over the surface 770 X-ray signals emanating from the impinging position on the substrate may reach the detector 750. When the electron beam is scanned in the direction given by the arrow in the figure a signal of the square shaped electron beam will be as the dotted FIG. 760 in front of the patterned aperture resolver 740. The sloped portions of the figure represents an X-ray signal partially hidden by an opening 735 in a pattern aperture modulator 730. By analyzing the shape of the detected intensity modulated signal received by the detector 750 one may be able to determine the shape of the beam in the direction of deflection.

Figure 2A:
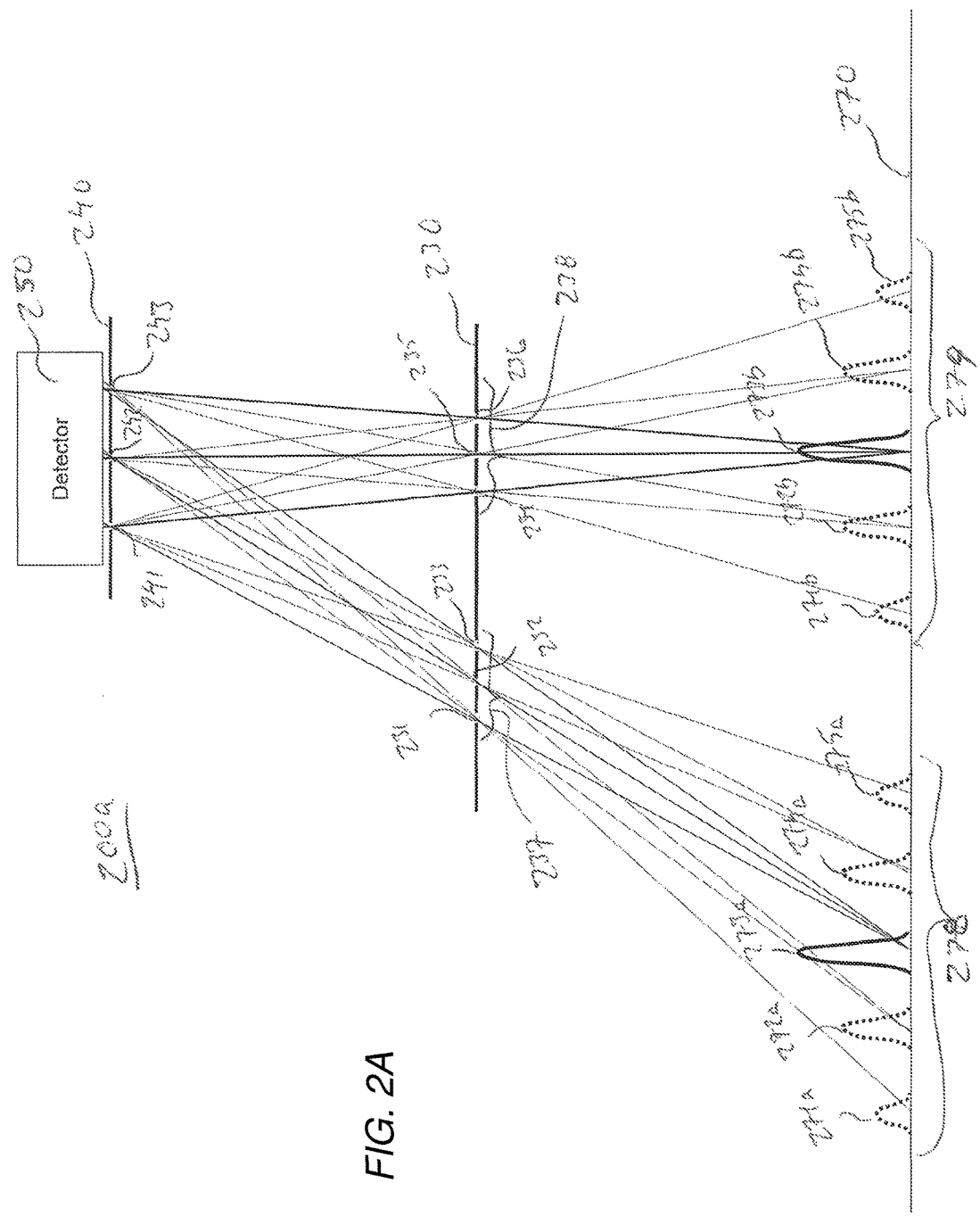
FIGS. 2A and 2B depict schematic side views of two example embodiments of patterned aperture modulator and patterned aperture resolver setups in the device for calibrating/verifying an electron beam.

FIG. 2A depicts a schematic side view of a first example embodiment of a patterned aperture modulator and patterned aperture resolver setup in the device for calibrating/verifying an electron beam. In this embodiment the patterned aperture modulator 230 comprises a first set of apertures 237 and a second set of apertures 238. The first set of apertures 237 comprises 3 openings 231, 232, 233 regularly spaced from each other. The second set of apertures 238 comprises three openings 234, 235, 236 regularly spaced from each other. The first and second sets of apertures 237, 238 are arranged at a distance from each other which is larger than the individual distance between two openings in one of the first or second set of apertures 237, 238, i.e., the distance between openings 233 and 234 is larger than the distance between 231 and 232 or the distance between 235 and 236. In certain embodiments, the patterned aperture resolver comprises three openings 241, 242, 243.

As the electron beam is deflected over the substrate 270 X-rays are created which will travel in the direction towards the detector 250. Only some of the will hit the detector because of the arrangement with the patterned aperture modulator 230 and the patterned aperture resolver in front of the detector.

As the electron beam hits position 271*a* only a small portion of the x-rays created at this position will hit the detector, which is illustrated by the single dotted line. This small portion will hit the rightmost position of the detector 250 since it goes via opening 231 in the patterned aperture modulator 230 and a third opening 243 in the patterned aperture resolver 240.

When the electron beam hits position 272*a* a somewhat larger portion of the X-rays will pass through the patterned aperture modulator 230 and the patterned aperture resolver 240 which is indicated by two dotted lines from position 272*a*. A first line will pass through opening 231 and opening 242 to a middle position on the detector 250. A second line will pass through opening 232 and opening 243 to a rightmost position on the detector 250.

When the electron beam hits position 273*a* a maximum portion of the X-rays from a first area 278 will pass through the patterned aperture modulator 230 and the patterned aperture resolver 240 which is indicated by three dotted lines from position 273*a*. A first line will pass through opening 231 and opening 241 to a leftmost position on the detector 250. A second line will pass through opening 232 and opening 242 to a middle position on the detector 250. A third line will pass through opening 233 and opening 243 to a rightmost position on the detector 250.

When the electron beam hits position 274*a* the amount of X-rays reaching the detector is decreased compared with position 273*a*. And when the electron beam hits position 275*a* the amount of X-rays reaching the detector is further reduced to be smaller compared to position 274*a*.

Each of position 271*a*-275*a* in the first area 278 may be used for determining the position, size, shape and speed of the electron beam, where 273*a* would be the main peak and 271*a*, 272*a*, 274*a*, 275*a* are side lobes that may or may not be used for calibration/verification purposes. The difference between the positions 271*a*-275*a* in the first area 278 are the amount of X-ray signals which is received by the detector.

An exemplary advantage of a plurality of openings in the patterned aperture modulator and patterned aperture resolver may be to increase the detected signal while maintaining the resolution of the detected X-ray signal.

X-rays emanating from the first area 278 of the substrate 270 will pass through a first set of openings 237 in the patterned aperture modulator 230.

X-rays emanating from a second area 279 of the substrate 270 will be allowed to pass through a second set of openings in the patterned aperture modulator 230. In this embodiment the first set of openings 237 is equal to the second set of opening, i.e., the number of openings, the size and shape of the openings in the first set 237 is identical to the second set 238. For this reason a signal strength pattern of the x-rays from different positions 271*a*-275*a* in the first area 278 of the substrate 270 will be identical to a signal strength pattern of the x-rays from different positions 271*b*-275*b* in the second area 279 of the substrate 270.

Figure 2B:
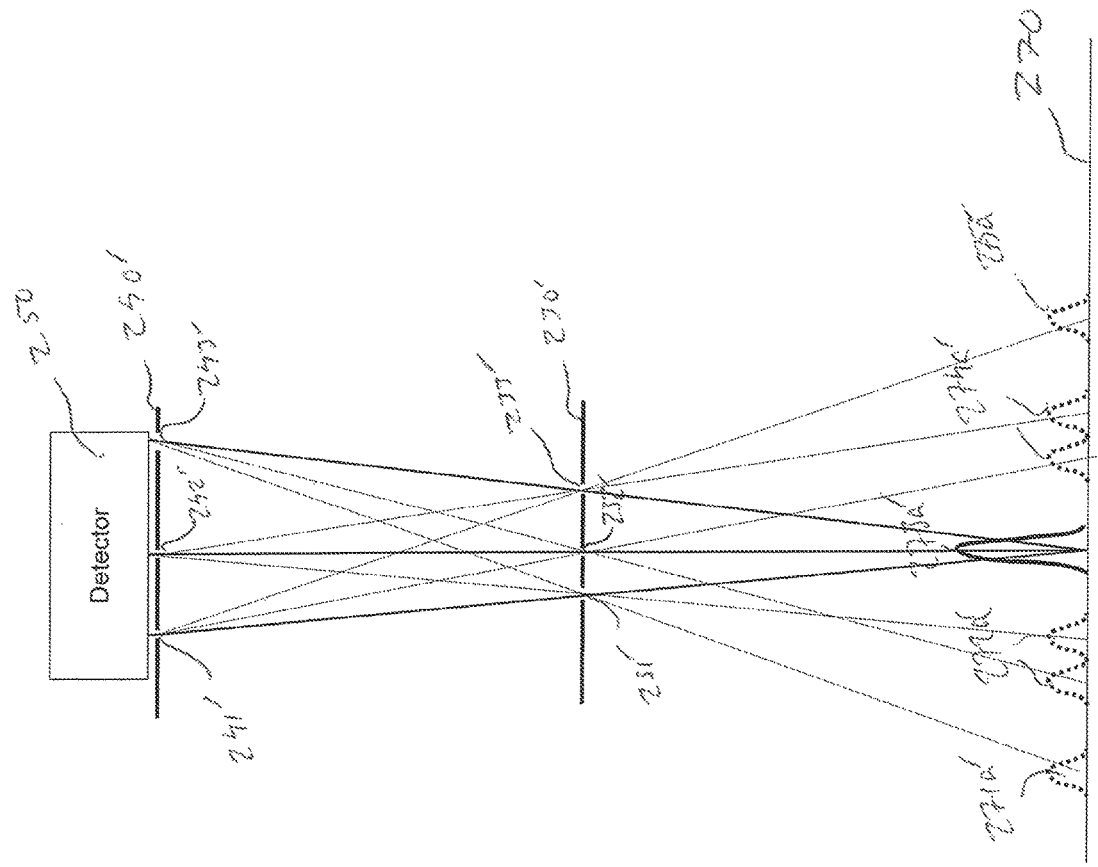

FIG. 2B depicts a schematic side view of a second example embodiment of a patterned aperture modulator and patterned aperture resolver setup in the device for calibrating/verifying an electron beam. In this second embodiment a patterned aperture resolver 240' is provided with an irregular pattern of openings 241', 242', 243'. A patterned aperture modulator 230' is also provided with an irregular pattern of openings 231', 232', 233'.

By arranging irregular patterns of openings in at least one of the patterned aperture modulator and/or the pattern aperture resolver the ratio of the signal strength between a position where the detector 250 is detecting X-ray signals from each of the openings in the patterned aperture modulator 230' and a position in which only some of the openings in the patterned aperture detector 230' is increased, i.e., the difference between full strength signal and semi full strength signal is increased by changing at least one of the patterned aperture modulator and/or patterned aperture resolver to an irregular pattern instead of a regular pattern.

The opening may have any type of shape including but not limited to, rectangular, circular, elliptical, square, triangular, hexagonal or slot formed. The intent of using irregular pattern is to make the central peak standing out among the side lobes. This may be advantageous in a case where a large number of openings are used.

Figure 5:
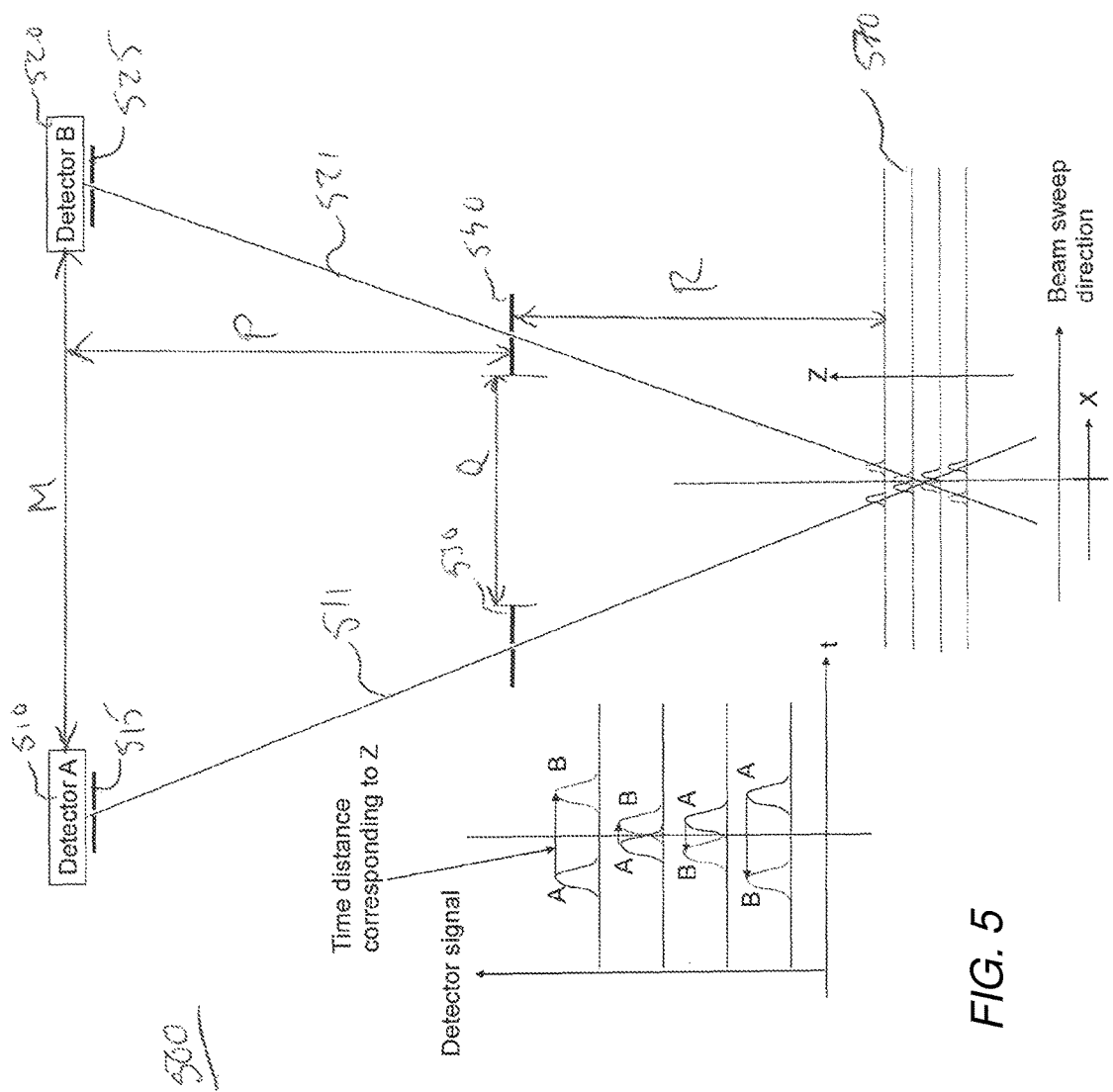
FIG. 5 depicts a schematic side view of a first example embodiment of a two detector device for calibrating/verifying an electron beam.

FIG. 5 illustrates an embodiment in which a first detector 510 and a second detector 520 are used. The first detector 510 and the second detector 520 are arranged at a predetermined distance M from each other. The first detector 510 is provided with a first patterned aperture resolver 515. FIG. 5 shows only a single beam to increase the clarity of the embodiment, but an actual system may use techniques similar to FIG. 2A or FIG. 2B. The second detector 520 is provided with a second patterned aperture resolver 525. The first and second detectors 510, 520 are provided in a first plane in parallel with a substrate 570. The first and second patterned aperture resolvers 515, 525 are provided in a second plane in parallel with the substrate 570. The first and second plane may be arranged at a predetermined distance from each other. In an example embodiment the first and second plane are the same, i.e., the patterned aperture resolver is attached onto the detector or the first detector 510 and the second detector are 1-dimensional or 2-dimensional arrays of separate detectors.

A first patterned aperture modulator 530 is provided at a predetermined distance Q from a second patterned aperture modulator 540. The first and second patterned aperture modulators 530, 540 are provided in a third plane in parallel with the substrate 570. The third plane is provided at a predetermined distance P from the second plane. The third plane is provided at a predetermined distance R from the substrate 570.

An arrangement with two detectors arranged in a plane in parallel with the substrate according to FIG. 5 may not only be used for calibrating/verifying the position, size, shape and speed of an electron beam in an X-Y plane at a surface of a substrate but also be used for detecting the topography of the surface of the substrate 570.

As indicated in the graph to the left of the two-detector setup, where the X-ray signal is on the Y-axis and the time is on the x-axis, a specific time difference between detectors A-B may correspond to a specific height. In the setup according to FIG. 5 there is only one point on the substrate 570 where an X-ray signal may reach the first detector 510 and the second detector 520 at the same time, this may be a nominal height of the substrate 570. If the first detector 510 is receiving the X-ray signal before the second detector 520 it is I an indication of a substrate point above the nominal height. In contrary, if the second detector 520 is receiving the X-ray signal before the first detector 510 it is an indication of a substrate point below the nominal height.

In order to cover a larger area of the substrate than just one position and to increase the detected signal, a number of openings may be provided in the first and second patterned aperture modulators 530, 540.

In still another example embodiment the at least first and second patterned aperture modulators are provided with a plurality of openings and the first and second patterned aperture resolvers 515, 525 are provided with a plurality of openings. In another example embodiment the plurality of openings in at least one of the patterned aperture resolvers are substituted with an array, 1-dimensional or 2-dimensional, of detectors.

Figure 6:
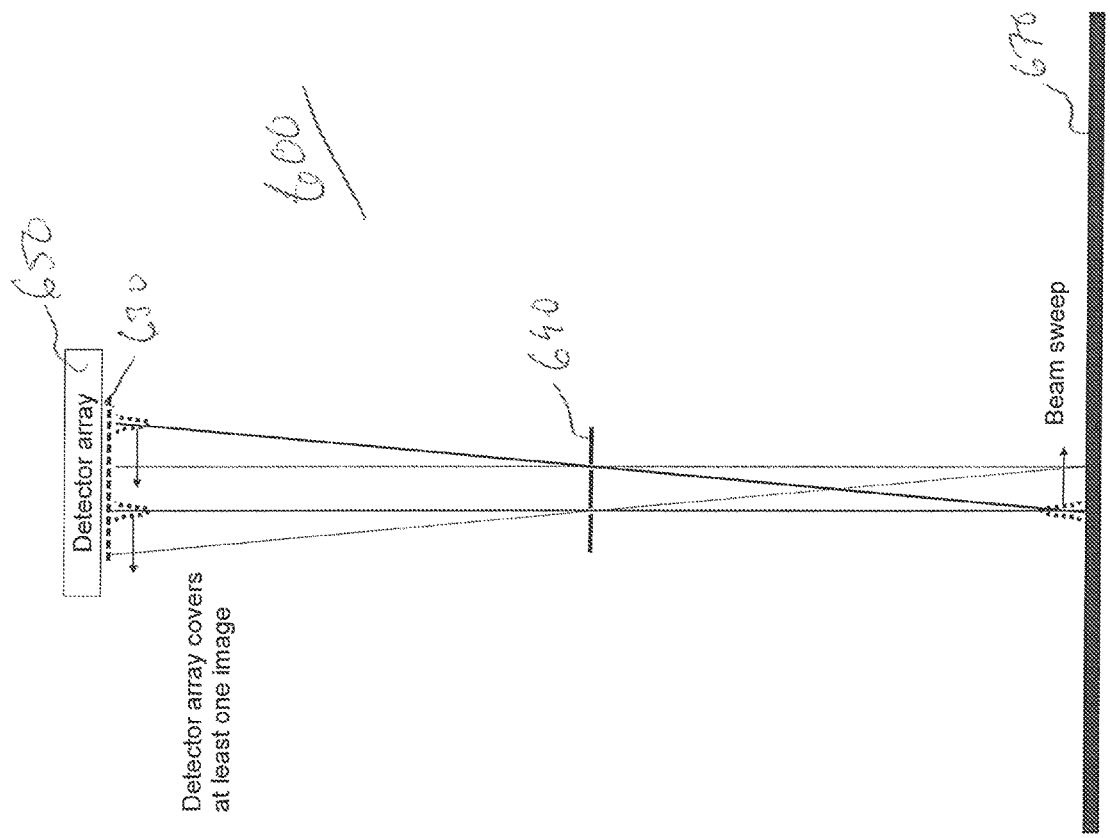
FIG. 6 depicts a schematic side view of a first example embodiment of a detector array device for calibrating/verifying an electron beam.

In FIG. 6 it is illustrated a schematic side view of another example embodiment of a patterned aperture modulator 640 and patterned aperture resolver 630 setup in the device 600 for calibrating/verifying an electron beam. In this embodiment the detector is a detector array in 1-dimension dimension or 2-dimensions. In the illustrated setup the detector array 650 will cover X-ray images from at least two positions on the substrate 670. If the detector array is 1-dimensional, the X-ray image is a 1-dimensional image of the electron beam. If the detector array is 2-dimensional, the X-ray image is a 2-dimensional image of the electron beam. The number of detectors in the array and the size of the detectors will determine the resolution of the X-ray image.

If the deflection speed is determined to be out of specification a warning signal may be sent to the operator of the machine. In an alternative embodiment when the deflection speed is determined to be out of specification the additive manufacturing machine may be switched off or put in an idle state.

In certain embodiments, the work piece may be provided with a reference pattern. This reference pattern may be used for calibrating the scan speed and relative position but also for detecting other deviations in the energy beam train.

The electron beam source is used for generating an electron beam 260 which may be deflected on the work table 250 by means of at least one deflection coil (not shown). By changing the magnetic field of the deflection coil the electron beam 260 may be moved at any desired position within a predetermined maximum area.

The deflection speed of the electron beam may be altered by changing the magnetic field of the deflection coil, i.e., by ramping the electrical current in the deflection coil at different speeds, where a higher ramping speed will result in a larger deflection speed than a lower ramping speed. The verification of the deflection speed is identical as previously described in relation to FIG. 1. The only difference between FIGS. 1 and 2 is the energy beam source and how the energy beam is deflected.

Figure 4:
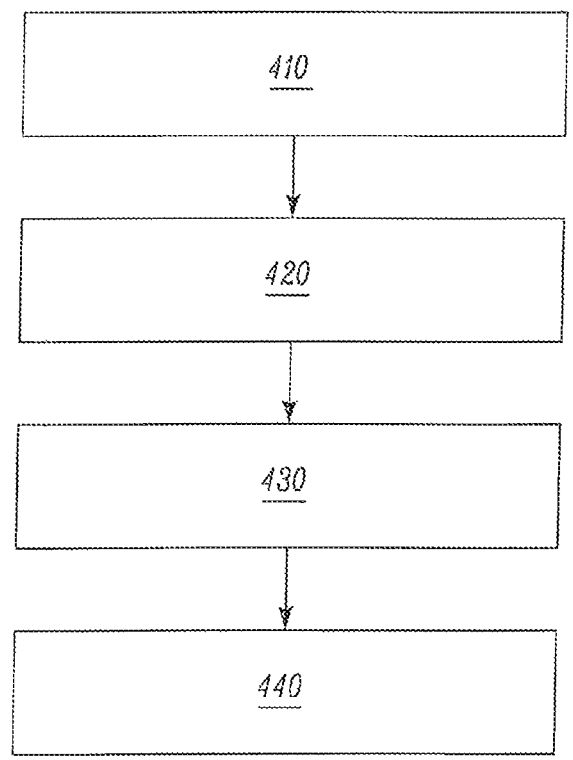
FIG. 4 depicts a schematic flow chart of an inventive method according to an embodiment of the present invention.

FIG. 4 depicts a schematic flow chart of an inventive method according to an embodiment of the present invention. In the method a 3-dimensional article is formed through successive fusion of parts of a powder bed, which parts correspond to successive cross sections of the 3-dimensional article.

In a first step, denoted by 410, a model of the 3-dimensional article is provided. The model may be generated by a suitable CAD-tool.

In a second step, denoted by 420, a first powder layer is applied on a work table.

In a third step, denoted by 430, an electron beam from an electron beam source is directed over the work table. The directing of the electron beam causing the first powder layer to fuse in first selected locations according to the model, so as to form a first part of a cross section of the three dimensional article.

In a fourth step, denoted by 440, intensity modulating X-rays from the powder layer or from a clean work table with a patterned aperture modulator and a patterned aperture resolver, wherein a verification of at least one of a size, position, scan speed and/or shape of the electron beam is achieved by comparing detected intensity modulated X-ray signals with saved reference values. The saved reference values may have been created when the machine was new. The reference values may have been created at any time earlier in the lifetime of the additive manufacturing machine.

In the illustrated examples above, the patterned aperture modulator and/or the patterned aperture resolver may be manufactured from a material which efficiently may shield from X-ray radiation, such as lead, brass, copper or other metals with high atomic numbers or alloys therefrom. In an example embodiment the patterned aperture modulator and/or the patterned aperture resolver may be made of a material with a relatively low atomic number such as aluminium and thereafter covered with another material having a high atomic number such as gold or copper.

In another aspect of the invention it is provided a program element configured and arranged when executed on a computer for calibrating/verifying a position, size, shape and deflection speed of an energy beam spot. The program element may specifically be configured to perform the steps of: arranging a patterned aperture resolver having at least one opening in front of at least one X-ray detector, where the at least one opening is facing towards the at least one X-ray detector, arranging a patterned aperture modulator between the patterned aperture resolver and a substrate and at a predetermined distance from the patterned aperture resolver and the substrate, where the patterned aperture modulator having a plurality of openings in at least a first direction, scanning an electron beam in at least a first direction on the substrate for generating X-rays to be received by the at least one X-ray detector, intensity modulating the X-rays emanating from the surface with the patterned aperture modulator and patterned aperture resolver, wherein a map of position, size and shape of the electron beam is achieved by mapping an intensity modulated X-ray signal from the detector with settings for controlling the electron beam, adjusting the settings for controlling the electron beam if the shape and/or size of the electron beam is deviating more than a predetermined value from a corresponding reference beam shape and/or a reference beam size, and repeating step c-e until the shape of the electron beam is deviating less than a predetermined value from a reference beam shape.

The program element may be installed in a computer readable storage medium. The computer readable storage medium may be the control unit 350 or another distinct and separate control unit, as may be desirable. The computer readable storage medium and the program element, which may comprise computer-readable program code portions embodied therein, may further be contained within a non-transitory computer program product. Further details regarding these features and configurations are provided, in turn, below.

As mentioned, various embodiments of the present invention may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (Fe-RAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like, as have been described elsewhere herein. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Various embodiments are described below with reference to block diagrams and flowchart illustrations of apparatuses, methods, systems, and computer program products. It should be understood that each block of any of the block diagrams and flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks.

Accordingly, blocks of the block diagrams and flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and flowchart illustrations, could be implemented by special purpose hardware-based computer systems that perform the specified functions or operations, or combinations of special purpose hardware and computer instructions.

Figure 8:
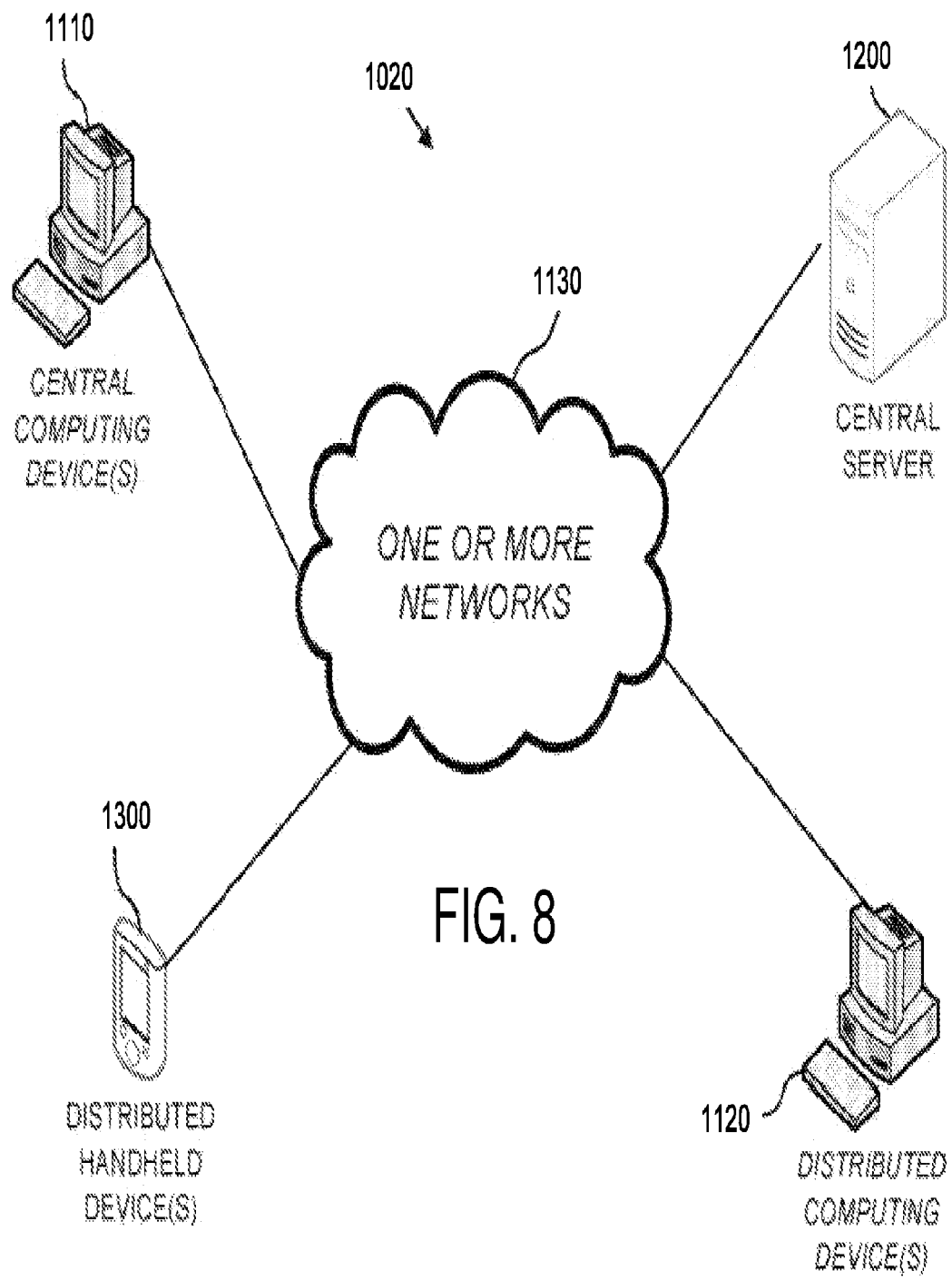
FIG. 8 is a block diagram of an exemplary system 1020 according to various embodiments.

FIG. 8 is a block diagram of an exemplary system 1020 that can be used in conjunction with various embodiments of the present invention. In at least the illustrated embodiment, the system 1020 may include one or more central computing devices 1110, one or more distributed computing devices 1120, and one or more distributed handheld or mobile devices 1300, all configured in communication with a central server 1200 (or control unit) via one or more networks 1130. While FIG. 8 illustrates the various system entities as separate, standalone entities, the various embodiments are not limited to this particular architecture.

According to various embodiments of the present invention, the one or more networks 1130 may be capable of supporting communication in accordance with any one or more of a number of second-generation (2G), 2.5G, third-generation (3G), and/or fourth-generation (4G) mobile communication protocols, or the like. More particularly, the one or more networks 1130 may be capable of supporting communication in accordance with 2G wireless communication protocols IS-136 (TDMA), GSM, and IS-95

(CDMA). Also, for example, the one or more networks 1130 may be capable of supporting communication in accordance with 2.5G wireless communication protocols GPRS, Enhanced Data GSM Environment (EDGE), or the like. In addition, for example, the one or more networks 1130 may be capable of supporting communication in accordance with 3G wireless communication protocols such as Universal Mobile Telephone System (UMTS) network employing Wideband Code Division Multiple Access (WCDMA) radio access technology. Some narrow-band AMPS (NAMPS), as well as TACS, network(s) may also benefit from embodiments of the present invention, as should dual or higher mode mobile stations (e.g., digital/analog or TDMA/CDMA/analog phones). As yet another example, each of the components of the system 1020 may be configured to communicate with one another in accordance with techniques such as, for example, radio frequency (RF), Bluetooth™ infrared (IrDA), or any of a number of different wired or wireless networking techniques, including a wired or wireless Personal Area Network ("PAN"), Local Area Network ("LAN"), Metropolitan Area Network ("MAN"), Wide Area Network ("WAN"), or the like.

Although the device(s) 1110-1300 are illustrated in FIG. 8 as communicating with one another over the same network 1130, these devices may likewise communicate over multiple, separate networks.

According to one embodiment, in addition to receiving data from the server 1200, the distributed devices 1110, 1120, and/or 1300 may be further configured to collect and transmit data on their own. In various embodiments, the devices 1110, 1120, and/or 1300 may be capable of receiving data via one or more input units or devices, such as a keypad, touchpad, barcode scanner, radio frequency identification (RFID) reader, interface card (e.g., modem, etc.) or receiver. The devices 1110, 1120, and/or 1300 may further be capable of storing data to one or more volatile or non-volatile memory modules, and outputting the data via one or more output units or devices, for example, by displaying data to the user operating the device, or by transmitting data, for example over the one or more networks 1130.

In various embodiments, the server 1200 includes various systems for performing one or more functions in accordance with various embodiments of the present invention, including those more particularly shown and described herein. It should be understood, however, that the server 1200 might include a variety of alternative devices for performing one or more like functions, without departing from the spirit and scope of the present invention. For example, at least a portion of the server 1200, in certain embodiments, may be located on the distributed device(s) 1110, 1120, and/or the handheld or mobile device(s) 1300, as may be desirable for particular applications. As will be described in further detail below, in at least one embodiment, the handheld or mobile device(s) 1300 may contain one or more mobile applications 1330 which may be configured so as to provide a user interface for communication with the server 1200, all as will be likewise described in further detail below.

Figure 9A:
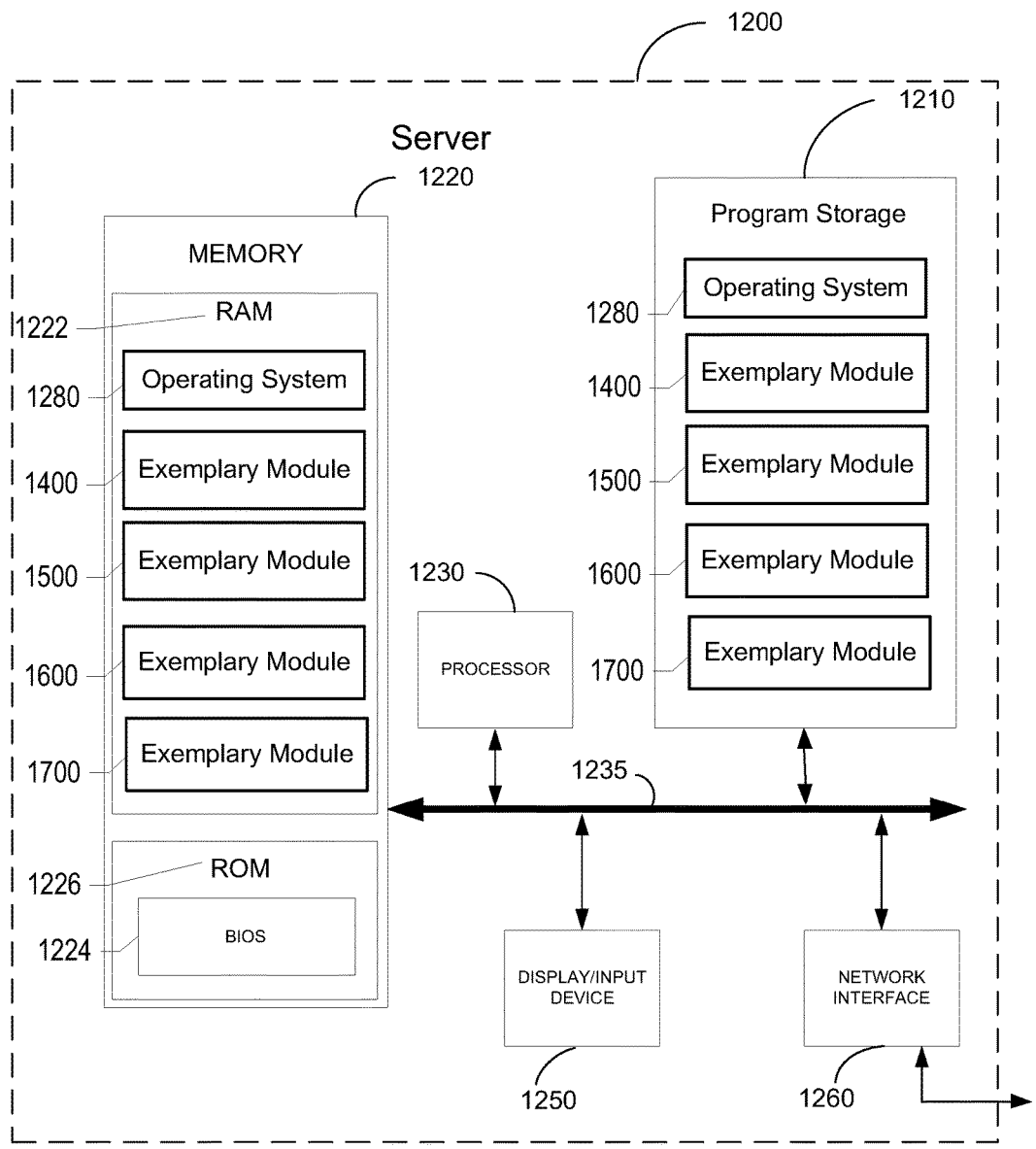
FIG. 9A is a schematic block diagram of a server 1200 according to various embodiments.

FIG. 9A is a schematic diagram of the server 1200 according to various embodiments. The server 1200 includes a processor 1230 that communicates with other elements within the server via a system interface or bus 1235. Also included in the server 1200 is a display/input device 1250 for receiving and displaying data. This display/input device 1250 may be, for example, a keyboard or pointing device that is used in combination with a monitor. The server 1200 further includes memory 1220, which typically includes both read only memory (ROM) 1226 and random access memory (RAM) 1222. The server's ROM 1226 is used to store a basic input/output system 1224 (BIOS), containing the basic routines that help to transfer information between elements within the server 1200. Various ROM and RAM configurations have been previously described herein.

In addition, the server 1200 includes at least one storage device or program storage 210, such as a hard disk drive, a floppy disk drive, a CD Rom drive, or optical disk drive, for storing information on various computer-readable media, such as a hard disk, a removable magnetic disk, or a CD-ROM disk. As will be appreciated by one of ordinary skill in the art, each of these storage devices 1210 are connected to the system bus 1235 by an appropriate interface. The storage devices 1210 and their associated computer-readable media provide nonvolatile storage for a personal computer. As will be appreciated by one of ordinary skill in the art, the computer-readable media described above could be replaced by any other type of computer-readable media known in the art. Such media include, for example, magnetic cassettes, flash memory cards, digital video disks, and Bernoulli cartridges.

Although not shown, according to an embodiment, the storage device 1210 and/or memory of the server 1200 may further provide the functions of a data storage device, which may store historical and/or current delivery data and delivery conditions that may be accessed by the server 1200. In this regard, the storage device 1210 may comprise one or more databases. The term "database" refers to a structured collection of records or data that is stored in a computer system, such as via a relational database, hierarchical database, or network database and as such, should not be construed in a limiting fashion.

A number of program modules (e.g., exemplary modules 1400-1700) comprising, for example, one or more computer-readable program code portions executable by the processor 1230, may be stored by the various storage devices 1210 and within RAM 1222. Such program modules may also include an operating system 1280. In these and other embodiments, the various modules 1400, 1500, 1600, 1700 control certain aspects of the operation of the server 1200 with the assistance of the processor 1230 and operating system 1280. In still other embodiments, it should be understood that one or more additional and/or alternative modules may also be provided, without departing from the scope and nature of the present invention.

In various embodiments, the program modules 1400, 1500, 1600, 1700 are executed by the server 1200 and are configured to generate one or more graphical user interfaces, reports, instructions, and/or notifications/alerts, all accessible and/or transmittable to various users of the system 1020. In certain embodiments, the user interfaces, reports, instructions, and/or notifications/alerts may be accessible via one or more networks 1130, which may include the Internet or other feasible communications network, as previously discussed.

In various embodiments, it should also be understood that one or more of the modules 1400, 1500, 1600, 1700 may be alternatively and/or additionally (e.g., in duplicate) stored locally on one or more of the devices 1110, 1120, and/or 1300 and may be executed by one or more processors of the same. According to various embodiments, the modules 1400, 1500, 1600, 1700 may send data to, receive data from, and utilize data contained in one or more databases, which may be comprised of one or more separate, linked and/or networked databases.

Also located within the server 1200 is a network interface 1260 for interfacing and communicating with other elements of the one or more networks 1130. It will be appreciated by one of ordinary skill in the art that one or more of the server 1200 components may be located geographically remotely from other server components. Furthermore, one or more of the server 1200 components may be combined, and/or additional components performing functions described herein may also be included in the server.

While the foregoing describes a single processor 1230, as one of ordinary skill in the art will recognize, the server 1200 may comprise multiple processors operating in conjunction with one another to perform the functionality described herein. In addition to the memory 1220, the processor 1230 can also be connected to at least one interface or other means for displaying, transmitting and/or receiving data, content or the like. In this regard, the interface(s) can include at least one communication interface or other means for transmitting and/or receiving data, content or the like, as well as at least one user interface that can include a display and/or a user input interface, as will be described in further detail below. The user input interface, in turn, can comprise any of a number of devices allowing the entity to receive data from a user, such as a keypad, a touch display, a joystick or other input device.

Still further, while reference is made to the "server" 1200, as one of ordinary skill in the art will recognize, embodiments of the present invention are not limited to traditionally defined server architectures. Still further, the system of embodiments of the present invention is not limited to a single server, or similar network entity or mainframe computer system. Other similar architectures including one or more network entities operating in conjunction with one another to provide the functionality described herein may likewise be used without departing from the spirit and scope of embodiments of the present invention. For example, a mesh network of two or more personal computers (PCs), similar electronic devices, or handheld portable devices, collaborating with one another to provide the functionality described herein in association with the server 1200 may likewise be used without departing from the spirit and scope of embodiments of the present invention.

According to various embodiments, many individual steps of a process may or may not be carried out utilizing the computer systems and/or servers described herein, and the degree of computer implementation may vary, as may be desirable and/or beneficial for one or more particular applications.

Figure 9B:
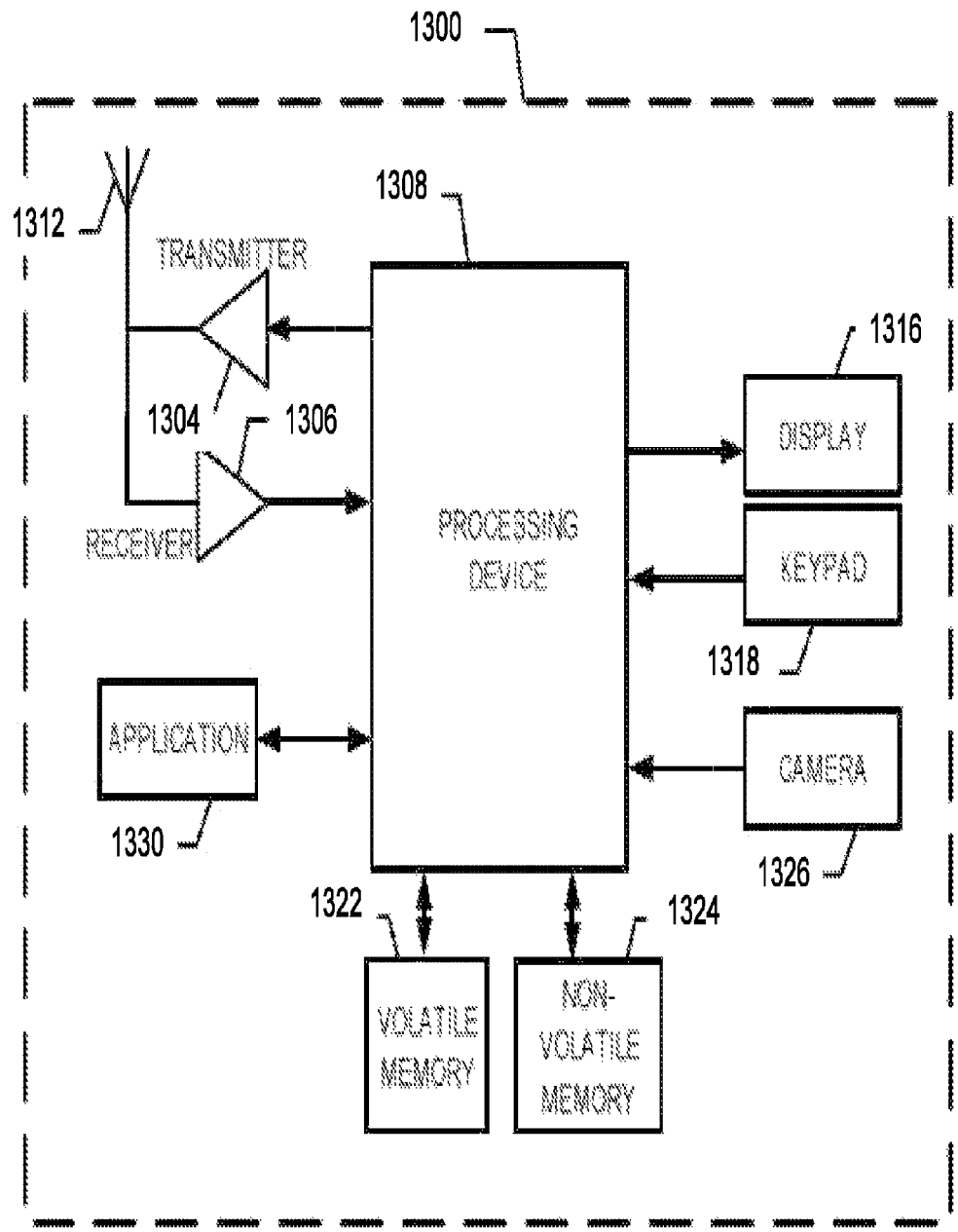
FIG. 9B is a schematic block diagram of an exemplary mobile device 1300 according to various embodiments.

FIG. 9B provides an illustrative schematic representative of a mobile device 1300 that can be used in conjunction with various embodiments of the present invention. Mobile devices 1300 can be operated by various parties. As shown in FIG. 9B, a mobile device 1300 may include an antenna 1312, a transmitter 1304 (e.g., radio), a receiver 1306 (e.g., radio), and a processing element 1308 that provides signals to and receives signals from the transmitter 1304 and receiver 1306, respectively.

The signals provided to and received from the transmitter 1304 and the receiver 1306, respectively, may include signaling data in accordance with an air interface standard of applicable wireless systems to communicate with various entities, such as the server 1200, the distributed devices 1110, 1120, and/or the like. In this regard, the mobile device 1300 may be capable of operating with one or more air interface standards, communication protocols, modulation types, and access types. More particularly, the mobile device 1300 may operate in accordance with any of a number of wireless communication standards and protocols. In a particular embodiment, the mobile device 1300 may operate in accordance with multiple wireless communication standards and protocols, such as GPRS, UMTS, CDMA2000, 1×RTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile device 1300 may according to various embodiments communicate with various other entities using concepts such as Unstructured Supplementary Service data (USSD), Short Message Service (SMS), Multimedia Messaging Service (MIMS), Dual-Tone Multi-Frequency Signaling (DTMF), and/or Subscriber Identity Module Dialer (SIM dialer). The mobile device 1300 can also download changes, add-ons, and updates, for instance, to its firmware, software (e.g., including executable instructions, applications, program modules), and operating system.

According to one embodiment, the mobile device 1300 may include a location determining device and/or functionality. For example, the mobile device 1300 may include a GPS module adapted to acquire, for example, latitude, longitude, altitude, geocode, course, and/or speed data. In one embodiment, the GPS module acquires data, sometimes known as ephemeris data, by identifying the number of satellites in view and the relative positions of those satellites.

The mobile device 1300 may also comprise a user interface (that can include a display 1316 coupled to a processing element 1308) and/or a user input interface (coupled to a processing element 308). The user input interface can comprise any of a number of devices allowing the mobile device 1300 to receive data, such as a keypad 1318 (hard or soft), a touch display, voice or motion interfaces, or other input device. In embodiments including a keypad 1318, the keypad can include (or cause display of) the conventional numeric (0-9) and related keys (#, *), and other keys used for operating the mobile device 1300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The mobile device 1300 can also include volatile storage or memory 1322 and/or non-volatile storage or memory 1324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database mapping systems, data, applications, programs, program modules, scripts, source code, object code, byte code, compiled code, interpreted code, machine code, executable instructions, and/or the like to implement the functions of the mobile device 1300.

The mobile device 1300 may also include one or more of a camera 1326 and a mobile application 1330. The camera 1326 may be configured according to various embodiments as an additional and/or alternative data collection feature, whereby one or more items may be read, stored, and/or transmitted by the mobile device 1300 via the camera. The mobile application 1330 may further provide a feature via which various tasks may be performed with the mobile device 1300. Various configurations may be provided, as may be desirable for one or more users of the mobile device 1300 and the system 1020 as a whole.

It will be appreciated that many variations of the above systems and methods are possible, and that deviation from the above embodiments are possible, but yet within the scope of the claims. Many modifications and other embodiments of the invention set forth herein will come to mind to one skilled in the art to which these inventions pertain having the benefit of the teachings presented in the foregoing descriptions and the associated drawings. Such modifications may, for example, involve using a different source of ray gun than the exemplified electron beam such as laser beam. Other materials than metallic powder may be used such as powders of polymers and powder of ceramics. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A device for detecting X-rays emanating from a substrate surface, said device comprising:
   at least one first X-ray detector;
   a patterned aperture resolver; and
   a patterned aperture modulator,
   wherein:
      said patterned aperture resolver includes at least one opening facing towards said X-ray detector, the patterned aperture resolver being positioned in front of said X-ray detector, the at least one opening defining a first pattern;
      said patterned aperture modulator is positioned between said patterned aperture resolver and said substrate at a predetermined distance from said patterned aperture resolver and said substrate, where said patterned aperture modulator has a plurality of openings in at least a first direction, the plurality of openings defining a second pattern, the second pattern being different, other than in a relative scale, from the first pattern, the plurality of openings comprising a first opening comprising a first micro-pattern and a second opening comprising a second micro-pattern different than the first micro-pattern, wherein the first micro-pattern is arranged in a first non-periodic pattern and the second micro-pattern is arranged in a second non-periodic pattern that is different than the first non-periodic pattern; and
      said x-rays emanating from said substrate surface are intensity modulated with said patterned aperture modulator and patterned aperture resolver before being detected by said X-ray detector.

2. The device according to claim 1, wherein said first and second patterns are each either a 1-dimensional pattern or a 2-dimensional pattern.

3. The device according to claim 2, wherein:
   an opening at a first position of said patterned aperture resolver is configured with a first type of micro-pattern; and
   an opening at a second position of said patterned aperture resolver is configured with a second type of micro-pattern, said second type of micro-pattern being different relative to said first type of micro-pattern.

4. The device according to claim 3, wherein said first type of micro-pattern is a plurality of slots in a first direction.

5. The device according to claim 4, wherein said second type of micro-pattern is a plurality of slots in a second direction, said second direction being different relative to said first direction.

6. The device according to claim 1, wherein a base material of said patterned aperture modulator and said patterned aperture resolver is designed for shielding x-ray radiation.

7. The device according to claim 1, wherein a vacuum window is positioned between said X-ray detector and said patterned aperture resolver with the X-ray detector disposed external of the vacuum window and the patterned aperture resolver disposed internal of the vacuum window.

8. The device according to claim 1, wherein said substrate is provided with a reference pattern.

9. The device according to claim 1, wherein said patterned aperture resolver is arranged at a distance from said X-ray detector.

10. The device according to claim 1, wherein said patterned aperture resolver is replaced by a patterned detector.

11. The device according to claim 1, further comprising at least one second X-ray detector arranged with a patterned aperture resolver and a patterned aperture modulator, said patterned aperture resolver having at least one opening facing towards said at least one second X-ray detector being arranged in front of said at least one second X-ray detector, said patterned aperture modulator being provided between said patterned aperture resolver and said substrate at a predetermined distance from said patterned aperture resolver and said substrate, said patterned aperture modulator having a plurality of openings in at least a first direction, said x-rays from said surface being intensity modulated with said patterned aperture modulator and said patterned aperture resolver before being detected by said at least one second X-ray detector, said at least one first X-ray detector and said at least one second X-ray detector being arranged at a predetermined distance from each other for detecting height variations in a surface of said substrate.

12. The device according to claim 11, wherein said first and second x-ray detectors are positioned in a plane in parallel with the substrate and said height information is determined by triangulation.

13. The device according to claim 11, wherein said first detector is essentially in parallel with said substrate and said second detector is essentially perpendicular with the substrate.

14. The device according to claim 11, wherein said at least one first and said at least one second detectors are configured as a single unit.

15. The device according to claim 11, wherein said at least one first and said at least one second detectors are configured as separate units.

16. The device according to claim 1, wherein:
   said at least one opening in said patterned aperture resolver comprises two or more openings; and
   said first pattern defined by said two or more openings is a non-periodic pattern.

17. The device according to claim 16, wherein said non-periodic pattern of said two or more openings in said patterned aperture resolver is either a one-dimensional pattern or a two-dimensional pattern.

18. The device according to claim 16, wherein:
   said first pattern is defined by a first set of spacing between each of the two or more openings of said patterned aperture resolver; and said second pattern is defined by a second set of spacing between each of the plurality of openings of said pattern aperture modulator, the second set of spacing being different, other than in a relative spacing scale, from the first set of spacing.

19. The device according to claim 1, wherein:

said second pattern defined by said plurality of openings in said patterned aperture modulator is a non-periodic pattern, and the non-periodic pattern is either a 1-dimensional pattern or a 2-dimensional pattern.

20. The device according to claim 1, wherein:

the first micro-pattern comprises a plurality of slits in a first direction; and the second micro-pattern comprises a plurality of slits in a second direction different than the first direction.

21. The device of claim 1, wherein the substrate is configured to receive the X-rays in a first direction and to emanate said X-rays in a second direction toward the patterned aperture modulator and the patterned aperture resolver, wherein the second direction is opposite the first direction.

22. The device of claim 7, wherein the vacuum window forms a vacuum chamber such that the patterned aperture resolver disposed internally of the vacuum window is sealed within the vacuum chamber.

* * * * *